(12) United States Patent
Sharma et al.

(10) Patent No.: US 12,271,590 B2
(45) Date of Patent: Apr. 8, 2025

(54) LOSSLESS COMPRESSION OF LARGE DATA SETS FOR SYSTEMS ON A CHIP

(71) Applicant: Meta Platforms Technologies, LLC, Menlo Park, CA (US)

(72) Inventors: Sridhar Gurumurthy Isukapalli Sharma, Palo Alto, CA (US); Richard Lawrence Greene, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/934,835

(22) Filed: Sep. 23, 2022

(65) Prior Publication Data

US 2024/0094907 A1 Mar. 21, 2024

Related U.S. Application Data

(60) Provisional application No. 63/369,616, filed on Jul. 27, 2022.

(51) Int. Cl.
*G06F 3/06* (2006.01)

(52) U.S. Cl.
CPC ............ *G06F 3/0608* (2013.01); *G06F 3/064* (2013.01); *G06F 3/0673* (2013.01)

(58) Field of Classification Search
CPC ....... G06F 3/0608; G06F 3/064; G06F 3/0673
See application file for complete search history.

(56) References Cited

U.S. PATENT DOCUMENTS

| | | | |
|---|---|---|---|
| 11,809,807 B1 * | 11/2023 | Li | H03M 7/3086 |
| 2004/0041813 A1 | 3/2004 | Kim | |
| 2014/0355665 A1 | 12/2014 | Wegener | |
| 2015/0093036 A1 | 4/2015 | Park et al. | |
| 2016/0148670 A1 * | 5/2016 | Quach | G06F 1/3275 |
| | | | 713/323 |
| 2017/0150147 A1 | 5/2017 | Forsyth et al. | |
| 2017/0371797 A1 * | 12/2017 | Oportus Valenzuela | |
| | | | G06F 12/0842 |
| 2018/0004744 A1 * | 1/2018 | Guilford | G06F 16/2255 |
| 2018/0089091 A1 | 3/2018 | Akenine-Moller et al. | |
| 2021/0405382 A1 * | 12/2021 | Pendse | H01L 25/18 |
| 2022/0051467 A1 | 2/2022 | Woop et al. | |
| 2022/0156287 A1 * | 5/2022 | Zhang | G06F 3/0659 |
| 2023/0418827 A1 * | 12/2023 | Kondiles | G06F 16/2379 |

FOREIGN PATENT DOCUMENTS

| | | |
|---|---|---|
| WO | 2015061541 A1 | 4/2015 |
| WO | 2018031949 A1 | 2/2018 |
| WO | 2022015020 A1 | 1/2022 |

OTHER PUBLICATIONS

"Distributed Temporal Cache for Systems on Chip," U.S. Appl. No. 17/504,292, filed Oct. 18, 2021, 55 pages.
European Search Report for European Patent Application No. 23187932.1, dated Dec. 18, 2023, 10 pages.

* cited by examiner

*Primary Examiner* — Tasnima Matin
(74) *Attorney, Agent, or Firm* — Greenberg Traurig, LLP

(57) ABSTRACT

A system on a chip (SoC) includes a first subsystem, a second subsystem and a compression block connected to the first and second subsystems, wherein the compression block includes a decoder and an encoder. The compression block receives spill data generated by a compute element in one of the first and second subsystems, compresses the spill data using the encoder and stores the compressed spill data in a data block in local memory of one of the compute elements.

20 Claims, 18 Drawing Sheets

LOSSLESS COMPRESSION OF LARGE DATA SETS FOR SYSTEMS ON A CHIP

This application claims the benefit of U.S. Provisional Patent Application No. 63/369,616, filed 27 Jul. 2022, the entire contents of which are incorporated herein by reference.

TECHNICAL FIELD

This disclosure generally relates to memory management and, in particular, to memory efficient handling of large data sets in virtual memory systems.

BACKGROUND

Computing systems use volatile memory such as Static Random-Access Memory (SRAM) to store executable code and data while the system is in operation. SRAM is considered volatile because, although SRAM uses latching circuitry to store each data bit, the data stored in SRAM is lost when power is removed.

Systems on a Chip (SoCs) often dedicate a large portion of die area to SRAM. On-die SRAM provides very large bandwidth, low latency, and lower power memory solutions. Such solutions, however, often are distributed in nature. That is, portions of the on-die SRAM distributed as local memory are located close to the compute element or compute elements that use the memory. Such an approach allows for very wide and consequently high bandwidth, low latency interfaces, while minimizing energy spent in communicating across long wires on the die. Latency may, however, become an issue when sharing distributed local memory with compute elements that are not located close to the memory as this will necessitate narrower connections to avoid large number of traces running across the die.

An artificial reality system is one type of computer system that relies on nonvolatile memories such as SRAM. In general, artificial reality is a form of reality that has been adjusted in some manner before presentation to a user, which may include, e.g., a virtual reality, an augmented reality, a mixed reality, a hybrid reality, or some combination and/or derivatives thereof. Artificial reality systems include one or more devices for rendering and displaying content to users. Examples of artificial reality systems may incorporate a head-mounted display (HMD) worn by a user and configured to output artificial reality content to the user. In some examples, the HMD may be coupled (e.g., wirelessly or in tethered fashion) to a peripheral device that performs one or more artificial reality-related functions.

SUMMARY

In general, this disclosure is directed to techniques for compressing activation data and for storing portions of the compressed activation data in local memory instead of in off die memory. For example, a low power System-on-a-Chip (SoC) may have systems and subsystems that each incorporates SRAM distributed as a local memory. The local memory (LMEM) may be used as static memory (SMEM), cache or a combination of SMEM and cache. A portion of the local memory may also be allocated as virtual SMEM (VSMEM) and used to store large data sets, such as data resulting from data spills, locally as compressed data, reducing the use of off die Dynamic Random-Access Memory (DRAM).

In one example approach, a system on a chip (SoC) includes a first subsystem, a second subsystem and a compression block connected to the first and second subsystems, wherein the compression block includes a decoder and an encoder. The compression block receives spill data generated by a compute element in one of the first and second subsystems, compresses the spill data using the encoder and stores the compressed spill data in a data block in local memory of one of the compute elements. The techniques described herein may be implemented on an SoC that has multiple subsystems for performing various functions of the system. Examples of such subsystems include system control subsystems, communications subsystems, security subsystems, video processing subsystems, etc. Some of the subsystems may not need to be always active. For example, as discussed above, a video subsystem need not be powered on if a camera on the system is not in use.

In one example, in a system on a chip (SoC) including a first subsystem, a second subsystem and a compression block connected to the first and second subsystems, the compression block including a decoder and an encoder, wherein the first subsystem includes a first compute element connected to a first local memory and the second subsystem includes a second compute element connected to a second local memory, a method includes receiving, at the compression block, spill data generated by one of the first and second compute elements; compressing the spill data using the encoder; and storing the compressed spill data in a data block in the local memory of one of the first and second compute elements. In another example, a system on a chip (SoC) includes a first subsystem, the first subsystem comprising a first compute element and a first local memory connected to the first compute element, a second subsystem, the second subsystem comprising a second compute element and a second local memory connected to the second compute element, and a compression block connected to the first and second subsystems, the compression block including a decoder and an encoder. The compression block receives spill data generated by one of the first and second compute elements, compresses the spill data using the encoder and stores the compressed spill data in a data block in the local memory of one of the first and second compute elements. The compression block also receives read requests for spill data from one of the first and second compute elements, fetches the requested spill data from local memory of one of the first and second compute elements, decompresses the compressed spill data requested using the decoder and returns the decompressed spill data to the compute element making the read request.

In yet another example, an artificial reality system includes a head mounted display (HMD) configured to output artificial reality content, the HMD including a display and at least one system on a chip (SoC). The at least one SoC includes a first subsystem, the first subsystem comprising a first compute element and a first local memory connected to the first compute element, a second subsystem, the second subsystem comprising a second compute element and a second local memory connected to the second compute element, and a compression block connected to the first and second subsystems, the compression block including a decoder and an encoder. The compression block receives spill data generated by one of the first and second compute elements, compresses the spill data using the encoder and stores the compressed spill data in a data block in the local memory of one of the first and second compute elements. The compression block also receives read requests for spill data from one of the first and second compute elements, fetches the requested spill data from local memory of one of the first and second compute elements, decompresses the compressed spill data requested using the decoder and returns the decompressed spill data to the compute element making the read request.

The details of one or more examples of the techniques of this disclosure are set forth in the accompanying drawings and the description below. Other features, objects, and advantages of the techniques will be apparent from the description and drawings, and from the claims.

DETAILED DESCRIPTION

The efficient tracking and processing of large data sets is an important part of any artificial reality system. The systems are often memory constrained, with local memory providing low powered, speedy, access to a data set during processing. A System-on-Chip may, for instance, have systems and subsystems, each system and subsystem incorporating a limited amount of SRAM as local memory. In some examples, the local memory may be configured as SMEM, cache or a combination of SMEM and cache.

Machine learning plays an important part in artificial reality systems. Training machine learning models within the artificial reality system, however, can be tasking on the system since machine learning models may cause large activation when training, exceeding the memory allocated to a processor from the limited local memory. Data for the activation may be swapped out to an external memory, such as DRAM, but such an approach introduces latency and increases power consumption. For example, for a depth refinement model that swaps out to DRAM, the DRAM bandwidth for the activation (assuming 4 MB of local memory on the SoC) is about 13.15 GB/sec during inference, which happens about 50% of the time. Spills to DRAM are also extremely power inefficient (in some cases consuming 500 mW per activation).

A portion of local memory may be allocated as SMEM for processing data sets during activation. The allocated SMEM may, however, be inadequate for the data sets being processed, necessitating the swapping out of portions of the data set when the data set overflows the allocated local memory (i.e., a data spill). Data spills may occur, for example, while training a machine learning model, during image or graphics processing, in computer vision and when compressing large sets of data. The data spill is typically stored in cache locally or in other local memories, with blocks of data swapped out to off die memory as needed.

In another approach, the data sets may be stored in cache in local memory, with blocks of data swapped out to off die memory as needed. Such an approach can, however, conflict with other processes, such as computer vision or data compression, leading to thrashing between the competing processes. In addition, data spills such as those during activation are temporal in nature, typically written once and read once and with poor locality of reference, making cache less efficient.

Instead, in one example approach, a portion of local memory is allocated as virtual SMEM (VSMEM). The allocated VSMEM stores data spills from large data sets, such as activation data sets, locally in LMEM as compressed data in a virtualized space, reducing the use of off die memory.

Figure 1:
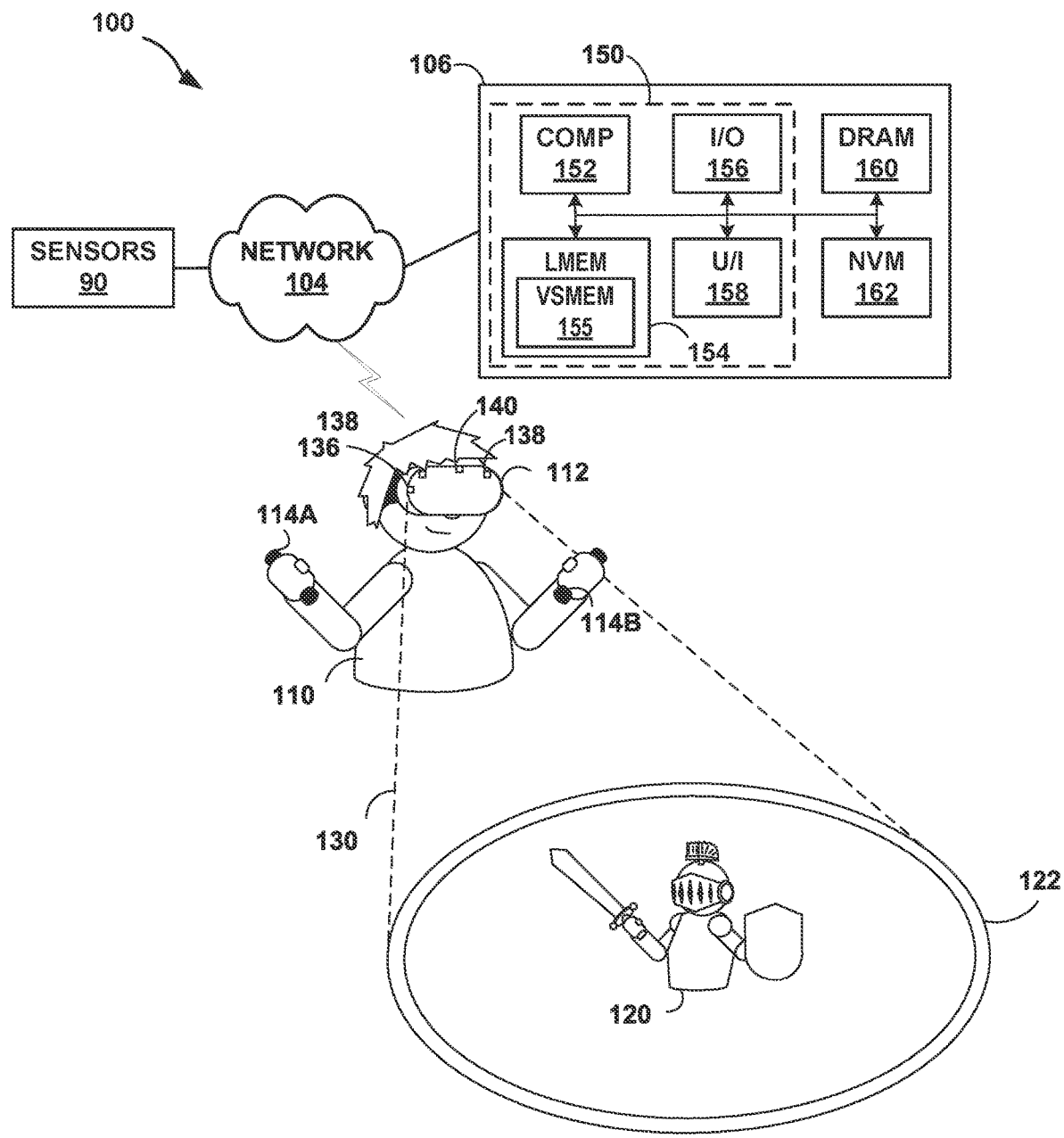
FIG. 1 is an illustration depicting an example artificial reality system that includes an SoC having compute elements and local memory, arranged in accordance with techniques described in this disclosure.

FIG. 1 is an illustration depicting an example artificial reality system that includes an SoC having compute elements and local memory, arranged in accordance with techniques described in this disclosure. The artificial reality system of FIG. 1 may be a virtual reality system, an augmented reality system, or a mixed reality system. In the example of FIG. 1, artificial reality system 100 includes a head mounted display (HMD) 112, one or more controllers 114A and 114B (collectively, "controller(s) 114"), and may in some examples include one or more external sensors 90 and/or a console 106.

HMD 112 is typically worn by user 110 and includes an electronic display and optical assembly for presenting artificial reality content 122 as virtual objects 120 to user 110. In addition, HMD 112 includes an internal control unit 140 and one or more sensors 136 (e.g., accelerometers) for tracking motion of the HMD 112. In one example approach, internal control unit 140 includes one or more SoCs, each SoC including two or more compute elements and memory distributed among specific compute elements but accessible to other compute elements as detailed below. HMD 112 may further include one or more image capture devices 138 (e.g., cameras, line scanners) for capturing image data of the surrounding physical environment. Although illustrated as a head-mounted display, AR system 100 may alternatively, or additionally, include glasses or other display devices for presenting artificial reality content 122 to user 110.

Each of controller(s) 114 is an input device that user 110 may use to provide input to console 106, HMD 112, or another component of AR system 100. Controller 114 may include one or more presence-sensitive surfaces for detecting user inputs by detecting a presence of one or more objects (e.g., fingers, stylus) touching or hovering over locations of the presence-sensitive surface. In some examples, controller(s) 114 may include an output display, which, in some examples, may be a presence-sensitive display. In some examples, controller(s) 114 may be a smartphone, tablet computer, personal data assistant (PDA), or other hand-held device. In some examples, controller(s) 114 may be a smartwatch, smart ring, or other wearable device. Controller(s) 114 may also be part of a kiosk or other stationary or mobile system. Alternatively, or additionally, controller(s) 114 may include other user input mechanisms, such as one or more buttons, triggers, joysticks, D-pads, or the like, to enable a user to interact with and/or control aspects of the artificial reality content 122 presented to user 110 by AR system 100.

In this example, console 106 is shown as a single computing device, such as a gaming console, workstation, a desktop computer, or a laptop. In other examples, console 106 may be distributed across a plurality of computing devices, such as a distributed computing network, a data center, or a cloud computing system. Console 106, HMD 112, and sensors 90 may, as shown in this example, be communicatively coupled via network 104, which may be a wired or wireless network, such as Wi-Fi, a mesh network or a short-range wireless communication medium, or combination thereof. Although HMD 112 is shown in this example as being in communication with, e.g., tethered to or in wireless communication with, console 106, in some implementations HMD 112 operates as a stand-alone, mobile AR system, and AR system 100 may omit console 106.

In general, AR system 100 renders artificial reality content 122 for display to user 110 at HMD 112. In the example of FIG. 1, a user 110 views the artificial reality content 122 constructed and rendered by an artificial reality application executing on compute elements withing HMD 112 and/or console 106. In some examples, the artificial reality content 122 may be fully artificial, i.e., images not related to the environment in which user 110 is located. In some examples, artificial reality content 122 may comprise a mixture of real-world imagery (e.g., a hand of user 110, controller(s) 114, other environmental objects near user 110) and virtual objects 120 to produce mixed reality and/or augmented reality. In some examples, virtual content items may be mapped (e.g., pinned, locked, placed) to a particular position within artificial reality content 122, e.g., relative to real-world imagery. A position for a virtual content item may be fixed, as relative to one of a wall or the earth, for instance. A position for a virtual content item may be variable, as relative to controller(s) 114 or a user, for instance. In some examples, the particular position of a virtual content item within artificial reality content 122 is associated with a position within the real-world, physical environment (e.g., on a surface of a physical object).

During operation, the artificial reality application constructs artificial reality content 122 for display to user 110 by tracking and computing pose information for a frame of reference, typically a viewing perspective of HMD 112. Using HMD 112 as a frame of reference, and based on a current field of view as determined by a current estimated pose of HMD 112, the artificial reality application renders 3D artificial reality content which, in some examples, may be overlaid, at least in part, upon the real-world, 3D physical environment of user 110. During this process, the artificial reality application uses sensed data received from HMD 112 and/or controllers 114, such as movement information and user commands, and, in some examples, data from any external sensors 90, such as external cameras, to capture 3D information within the real world, physical environment, such as motion by user 110 and/or feature tracking information with respect to user 110. Based on the sensed data, the artificial reality application determines a current pose for the frame of reference of HMD 112 and, in accordance with the current pose, renders the artificial reality content 122.

AR system 100 may trigger generation and rendering of virtual content items based on a current field of view 130 of user 110, as may be determined by real-time gaze tracking of the user, or other conditions. More specifically, image capture devices 138 of HMD 112 capture image data representative of objects in the real-world, physical environment that are within a field of view 130 of image capture devices 138. Field of view 130 typically corresponds with the viewing perspective of HMD 112. In some examples, the artificial reality application presents artificial reality content 122 comprising mixed reality and/or augmented reality. The artificial reality application may render images of real-world objects, such as the portions of a peripheral device, the hand, and/or the arm of the user 110, that are within field of view 130 along with virtual objects 120, such as within artificial reality content 122. In other examples, the artificial reality application may render virtual representations of the portions of a peripheral device, the hand, and/or the arm of the user 110 that are within field of view 130 (e.g., render real-world objects as virtual objects 120) within artificial reality content 122. In either example, user 110 can view the portions of their hand, arm, a peripheral device and/or any other real-world objects that are within field of view 130 within artificial reality content 122. In other examples, the artificial reality application may not render representations of the hand or arm of user 110.

To provide virtual content alone, or overlaid with real-world objects in a scene, HMD 112 may include a display system. For example, the display may include a projector and waveguide configured to translate the image output by the projector to a location viewable by a user's eye or eyes. The projector may include a display and a projector lens. The waveguide may include an input grating coupler to redirect light from the projector into the waveguide, and the waveguide may "trap" the light via total internal reflection (TIR). For example, the display may include arrays of red, green, and blue LEDs. In some examples, a color image may be formed by combination of the red, green, and blue light from each of the red, green, and blue LED arrays via a combiner. The waveguide may include an output grating to redirect light out of the waveguide, for example, towards an eye box. In some examples, the projector lens may collimate light from the display, e.g., the display may be located substantially at a focal point of the projector lens. The grating coupler may redirect the collimated light from the display into the waveguide, and the light may propagate within the waveguide via TIR at the surfaces of the waveguide. The waveguide may include an output structure, e.g., holes, bumps, dots, a holographic optical element (HOE), a diffractive optical element (DOE), etc., to redirect light from the waveguide to a user's eye, which focuses the collimated light from the display of the projector on the user's retina, thereby reconstructing the display image on the user's retina. In some examples, the TIR of the waveguide functions as a mirror and does not significantly affect the image quality of the display, e.g., the user's view of the display is equivalent to viewing the display in a mirror.

As further described herein, one or more devices of artificial reality system 100, such as HMD 112, controllers 114 and/or a console 106, may include SoCs. Further, one of more of the SoCs may include an SoC 150 having compute elements 152 and on-die memory 154 collocated with the compute elements. Although illustrated in detail with respect to console 106 in FIG. 1, HMD 112 may include an example instance of SoC 150. In one example approach, internal control unit 140 includes an SoC 150 having two or more subsystems. Each subsystem includes compute elements 152 (processors or coprocessors) and corresponding local memory 154 (e.g., SRAM) collocated with the compute elements 152. In some such SoCs, portions of on-die SRAM are physically distributed throughout the SoC as Local Memory (LMEM) 154, with a different instance of LMEM 154 located close to each compute element 152. Such an approach allows for very wide, high bandwidth and low latency interfaces to the closest compute elements, while minimizing energy spent in communicating across long wires on the die.

As further described herein, one or more devices of artificial reality system 100, such as HMD 112, controllers 114 and/or a console 106, may include SoCs. Further, one of more of the SoCs may include an SoC 150 having compute elements 152 and on-die memory 154 collocated with the compute elements. In one example approach, internal control unit 140 includes an SoC 150 having two or more subsystems. Each subsystem includes compute elements 152 (processors or coprocessors) and corresponding local memory 154 (e.g., SRAM) collocated with the compute elements 152. In some such SoCs, portions of on-die SRAM are physically distributed throughout the SoC as Local Memory (LMEM) 154, with a different instance of LMEM 154 located close to each compute element 152. Such an approach allows for very wide, high bandwidth and low latency interfaces to the closest compute elements, while minimizing energy spent in communicating across long wires on the die. In some example approaches, SoC 150 also includes an input/output interface 156, a user interface 158, and a connection to one or more of external DRAM 160 and nonvolatile memory 162.

In one example approach, each LMEM 154 may be configured as static memory (SMEM), cache memory, or a combination of SMEM and cache memory. In one such example approach, LMEM 154 includes SRAM. The SRAM may be configured as SMEM, cache memory, or a combination of SMEM and cache memory, with the SMEM used for temporary storage of spills from the processing of large data sets, such as activation data.

In one approach, for example, LMEM 154 is configured as an SMEM/Cache subsystem that incorporates 8 MB of on die SRAM, with 6 MB allocated as generic SMEM/Cache (can be configured as either), with the remaining 2 MB of SRAM allocated as activation data SMEM for temporary storage of spills from processing of large data sets. Simulations show that, by allocating 2 MB of on die SRAM of LMEM as activation data SMEM to hold the activation spills, the power consumption from activation spills may be reduced from the approximately 500 mW per activation attributed to spills to DRAM to about 268 mW for a given set of compute elements 152 and local memory 154.

In another example approach, LMEM 154 is configured as an SMEM/Cache subsystem that incorporates 8 MB of on die SRAM, with 4 MB allocated as generic SMEM/Cache (can be configured as either), with the remaining 4 MB of SRAM allocated as activation data SMEM for temporary storage of spills from processing of large data sets. Simulations show that, by allocating 4 MB of on die SRAM to hold the activation spills, the power consumption from activation spills may be reduced from the approximately 500 mW per activation attributed to spills to DRAM to about 150 mW for a given set of compute elements 152 and local memory 154.

Such approaches, however, have their drawbacks; allocating one-quarter to one-half of available SRAM to activation spills is effectively "Robbing Peter to pay Paul." The SMEM/cache portion of LMEM 154 is shared by many processes, so carving out a big chunk of on die SRAM for activation spills means that the limited memory is not available for other processes. In addition, there is competition for the limited memory available in local memory. Other workloads, for instance, would like to use cache; there is significant overhead associated with transitioning a memory from cache to SMEM and back. LMEM 154 may have been, for instance, carved into a cache having multiple ways. A transition of a portion of cache to VSMEM 155 for use during activation may require flushing the dirty cache lines (which is a function of the number of dirty lines and of the number of ways that need to be flushed) to create and allocate the needed SRAM (i.e., size of the VSMEM 155 that needs to be created). The length of the flushing operation is dependent on the bandwidth to DRAM 160 but it may take one or more milliseconds to flush 4 MB of VSMEM 155 to DRAM 160 when 50% or more of the cache lines are dirty. A better approach is to compress the activations so that they occupy a smaller footprint, and to store the compressed activations in a virtualized space like VSMEM 155.

In one example approach, lossless data compression is used to reduce the size of the data set being stored in VSMEM 155 during spills. This allows the use of a smaller portion of LMEM 154 allocated to VSMEM 155 for spills of large data sets. Such an approach also results in faster transitioning from cache to VSMEM 155. For instance, with 2:1 compression, 138 mW can be saved by allocating 2 MB of the 8 MB in LMEM 154 to VSMEM 155 in lieu of DRAM 160 for storing activation (or other data set) spills. Similarly with the same compression and a 4 MB of SMEM allocation, memory power is 56 mW, a 100 mW savings compared to the use of VSMEM 155 without compression. Traffic other than machine learning activation also may benefit from compression of related data sets in VSMEM 155, such as computer vision and image processing. VSMEM 155 may be allocated as virtual memory, with a physical portion of the memory allocated as SMEM in LMEM 15 and with data swapped out to an external volatile memory such as DRAM 160 as needed.

Figure 2A:
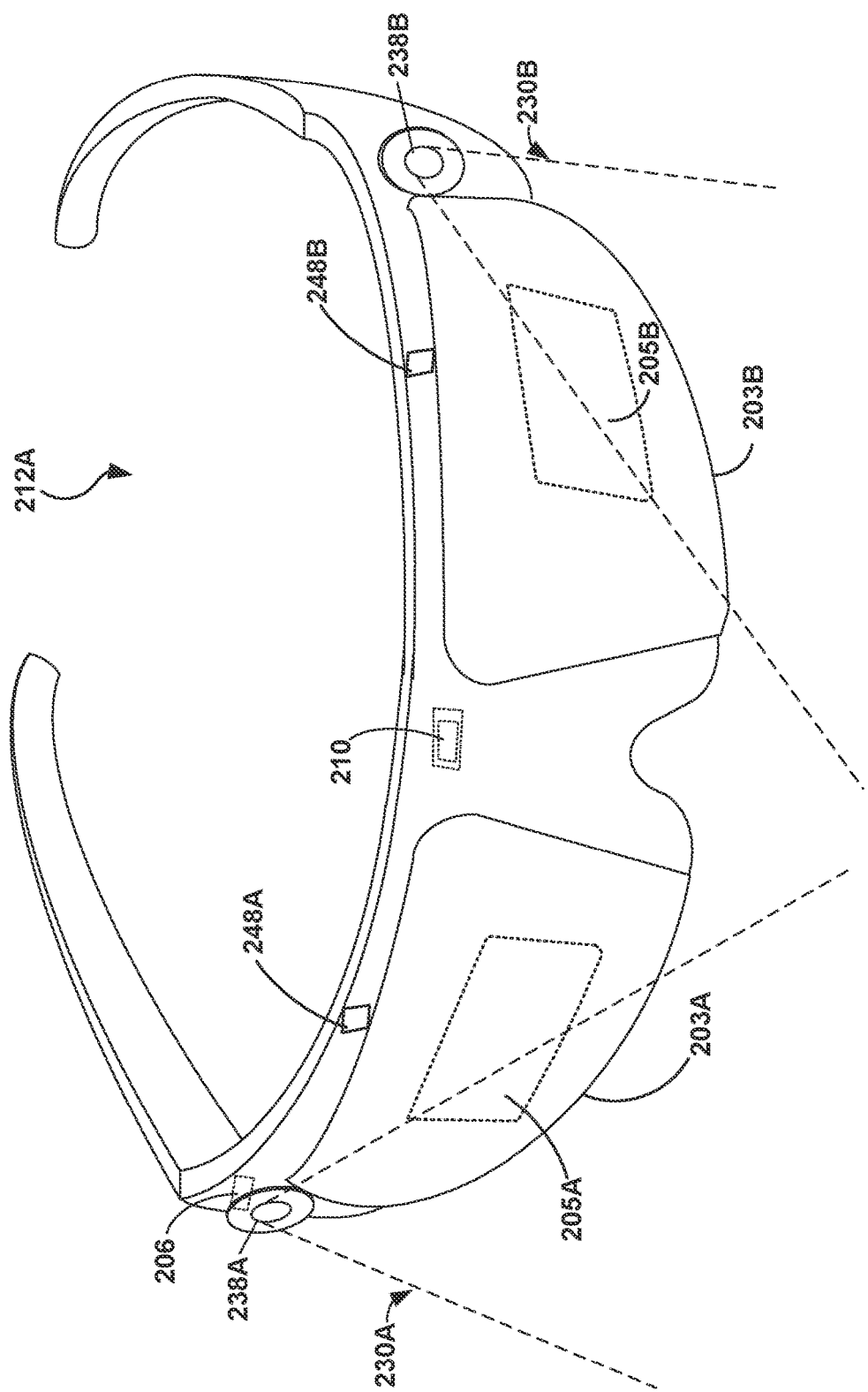
FIG. 2A is an illustration depicting an example HMD having compute elements and local memory shared by the compute elements, in accordance with techniques described in this disclosure.

FIG. 2A is an illustration depicting an example HMD having compute elements and local memory shared by the compute elements, in accordance with techniques described in this disclosure. HMD 212A of FIG. 2A may be an example of HMD 112 of FIG. 1. As shown in FIG. 2A, HMD 212A may take the form of glasses. HMD 212A may be part of an artificial reality system, such as AR system 100 of FIG. 1, or may operate as a stand-alone, mobile artificial realty system configured to implement the techniques described herein.

In this example, HMD 212A are glasses comprising a front frame including a bridge to allow the HMD 212A to rest on a user's nose and temples (or "arms") that extend over the user's ears to secure HMD 212A to the user. In addition, HMD 212A of FIG. 2A includes one or more projectors 248A and 248B, one or more waveguides 203A and 203B (collectively, "waveguides 203") and one or more waveguide output structures 205A and 205B (collectively, "waveguide output structures 205") configured to redirect light out of the waveguides 203A and 203B. In the example shown, projectors 248A and 248B (collectively, "projectors 248") may input light, e.g., collimated light, into waveguides 203A and 203B via a grating coupler (not shown) that redirects light from the projectors 248 into waveguides 203 such that the light is "trapped" via total internal reflection (TIR) within the waveguide. For example, projectors 248A and 248B may include a display and a projector lens. In some examples, waveguides 203 may be transparent and alternatively may be referred to as "windows 203" hereinafter. In some examples, the known orientation and position of windows 203 relative to the front frame of HMD 212A is used as a frame of reference, also referred to as a local origin, when tracking the position and orientation of HMD 212A for rendering artificial reality content according to a current viewing perspective of HMD 212A and the user. In some examples, projectors 248 can provide a stereoscopic display for providing separate images to each eye of the user.

In the example shown, waveguide output structures 205 cover a portion of the windows 203, subtending a portion of the field of view 230 viewable by a user 110 through the windows 203. In other examples, the waveguide output structures 205 can cover other portions of the windows 203, or the entire area of the windows 203.

As further shown in FIG. 2A, in this example, HMD 212A further includes one or more motion sensors 206, one or more integrated image capture devices 238A and 238B (collectively, "image capture devices 238"), an internal control unit 210, which may include an internal power source and one or more printed-circuit boards having one or more processors, memory, and hardware to provide an operating environment for executing programmable operations to process sensed data and present artificial reality content on waveguide output structures 205. Internal control unit 210 may include an SoC in accordance with the present disclosure that receives information from one or more of sensor(s) 206, image capture devices 238, controller(s) such as controller(s) 114 as shown in FIG. 1, and/or other sensors, and that forms part of a computing system to process the sensed data and present artificial reality content on waveguide output structures 205 in accordance with the present disclosure. In one example approach, each SoC includes two or more compute elements and memory distributed among specific compute elements but accessible to other compute elements as detailed below.

Image capture devices 238A and 238B (collectively, "image capture devices 238") may include devices such as video cameras, laser scanners, Doppler radar scanners, depth scanners, or the like, configured to output image data representative of the physical environment. More specifically, image capture devices 238 capture image data representative of objects in the physical environment that are within a field of view 230A, 230B of image capture devices 238, which typically corresponds with the viewing perspective of HMD 212A.

Figure 2B:
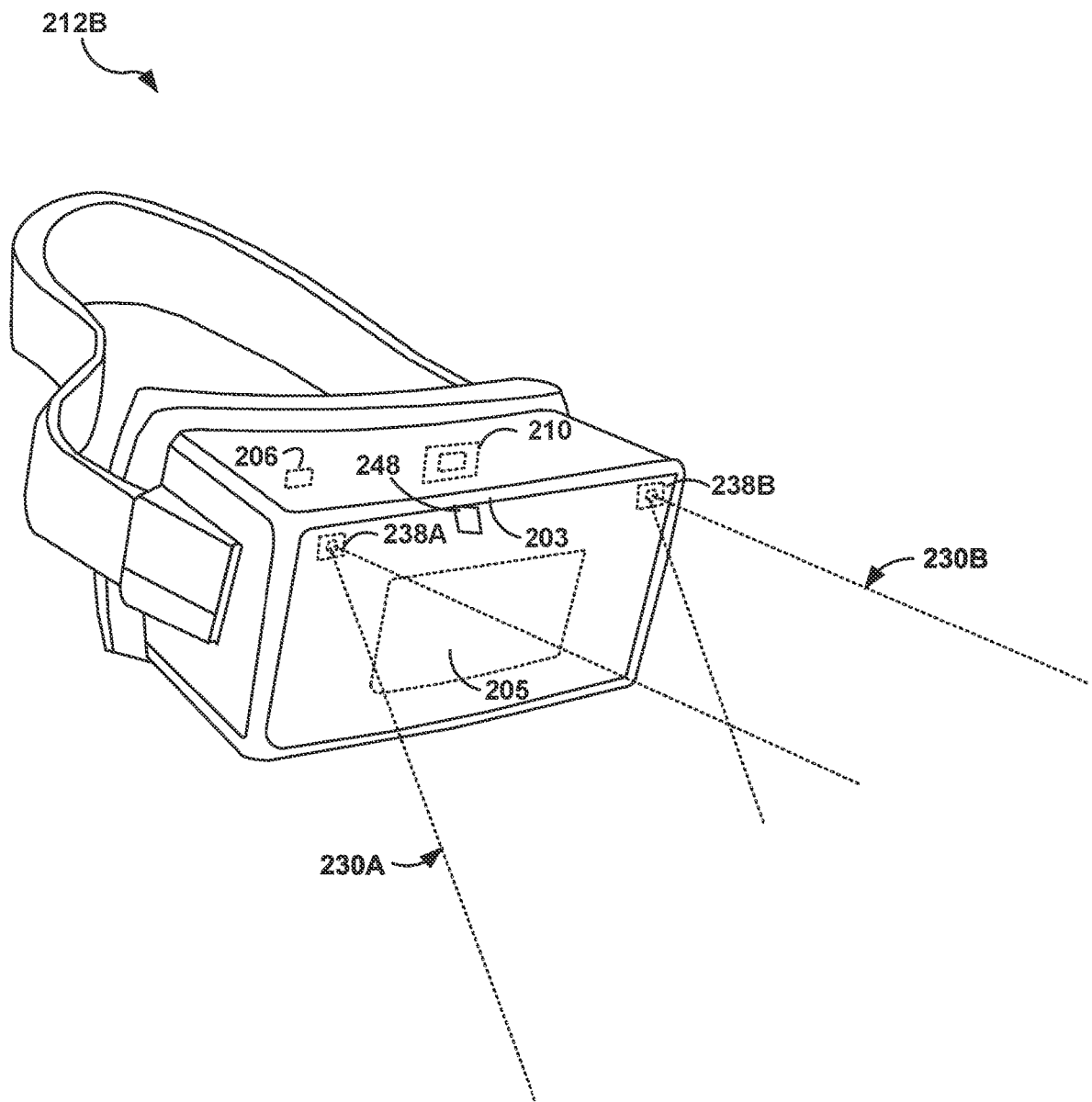
FIG. 2B is an illustration depicting another example HMD that includes an SoC having compute elements and local memory shared by the compute elements, in accordance with techniques described in this disclosure.

FIG. 2B is an illustration depicting another example HMD that includes an SoC having compute elements and local memory shared by the compute elements, in accordance with techniques described in this disclosure. HMD 212B may be part of an artificial reality system, such as artificial reality system 100 of FIG. 1, or may operate as a stand-alone, mobile artificial realty system configured to implement the techniques described herein.

In this example, HMD 212B includes a front rigid body and a band to secure HMD 212B to a user. In addition, HMD 212B includes a waveguide 203 (or, alternatively, a window 203) configured to present artificial reality content to the user via a waveguide output structure 205. In the example shown, projector 248 may input light, e.g., collimated light, into waveguide 203 via an input grating coupler (not shown) that redirects light from projector(s) 248 into waveguide 203 such that the light is "trapped" via total internal reflection (TIR) within waveguide 203. For example, projector 248 may include a display and a projector lens. In some examples, the known orientation and position of waveguide 203 relative to the front rigid body of HMD 212B is used as a frame of reference, also referred to as a local origin, when tracking the position and orientation of HMD 212B for rendering artificial reality content according to a current viewing perspective of HMD 212B and the user. In other examples, HMD 212B may take the form of other wearable head mounted displays, such as glasses or goggles.

Similar to HMD 212A of FIG. 2A, the example HMD 212B shown in FIG. 2B further includes one or more motion sensors 206, one or more integrated image capture devices 238A and 238B, an internal control unit 210, which may include an internal power source and one or more printed-circuit boards having one or more processors, memory, and hardware to provide an operating environment for executing programmable operations to process sensed data and present artificial reality content on waveguide output structure 205. Internal control unit 210 may include an SoC in accordance with the present disclosure that receives information from one or more of sensor(s) 206, image capture devices 238, controller(s) such as controller(s) 114 as shown in FIG. 1, and/or other sensors, and that forms part of a computing system to process the sensed data and present artificial reality content on waveguide output structures 205 in accordance with the present disclosure. In one example approach, each SoC includes two or more compute elements and memory distributed among specific compute elements but accessible to other compute elements as detailed below.

In some examples, portions of system-wide memory for SoCs of HMD 212A, 212B may be cached in local memory associated with compute elements of the SoCs when the local memory is available for caching. In some such examples, portions of LMEM are used to store activation data, as described further below.

Figure 3:
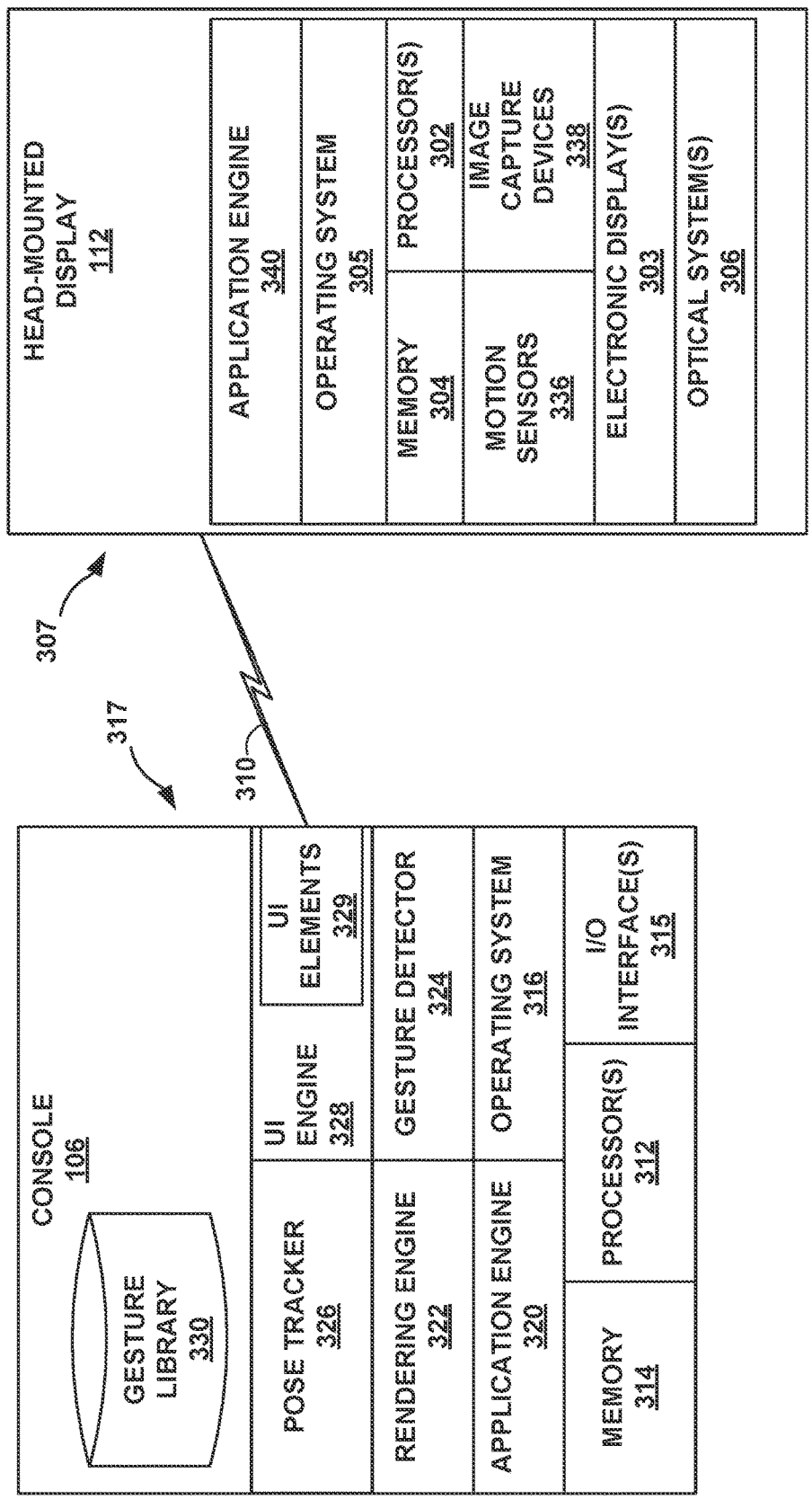
FIG. 3 is a block diagram showing example implementations of a console and an HMD of the artificial reality system of FIG. 1, in accordance with techniques described in this disclosure.

FIG. 3 is a block diagram showing example implementations of a console and an HMD of the artificial reality system of FIG. 1, in accordance with techniques described in this disclosure. In the example of FIG. 3, console 106 performs pose tracking, gesture detection, and user interface generation and rendering for HMD 112 based on sensed data, such as motion data and image data received from HMD 112 and/or external sensors.

In this example, HMD 112 includes one or more processors 302 and memory 304 that, in some examples, provide a computer platform for executing an operating system 305, which may be an embedded, real-time multitasking operating system, for instance, or other type of operating system. In turn, operating system 305 provides a multitasking operating environment 307 for executing one or more software components, including application engine 340. As discussed with respect to the examples of FIGS. 2A and 2B, processors 302 are coupled to one or more electronic displays 303, motion sensors 336, image capture devices 338, and, in some examples, optical system 306. Motion sensors 336 of FIG. 3 may be an example of motion sensors 206 of FIGS. 2A and 2B or of sensors 136 of FIG. 1. Image capture devices 338 of FIG. 3 may be an example of image capture devices 238 of FIGS. 2A and 2B or of image capture devices 138 of FIG. 1. In some examples, memory 304 includes local memory (such as the local memory 154 with integral VSMEM 155, as shown in FIG. 1) and one or more of volatile and nonvolatile memory (such as volatile memory 160 and nonvolatile memory 162 of FIG. 1, respectively).

In general, console 106 is a computing device that processes image and tracking information received from image capture devices 338 to perform gesture detection and user interface and/or virtual content generation for HMD 112. In some examples, console 106 is a single computing device, such as a workstation, a desktop computer, a laptop, or gaming system. In some examples, at least a portion of console 106, such as processors 312 and/or memory 314, may be distributed across a cloud computing system, a data center, or across a network, such as the Internet, another public or private communications network, for instance, broadband, cellular, Wi-Fi, and/or other types of communication networks for transmitting data between computing systems, servers, and computing devices.

In the example of FIG. 3, console 106 includes one or more processors 312 and memory 314 that, in some examples, provide a computer platform for executing an operating system 316, which may be an embedded, real-time multitasking operating system, for instance, or other type of operating system. In turn, operating system 316 provides a multitasking operating environment 317 for executing one or more software components. Processors 312 are coupled to I/O interfaces 315, which include one or more I/O interfaces for communicating with external devices, such as a keyboard, game controller(s), display device(s), image capture device(s), HMD(s), peripheral device(s), and the like. Moreover, I/O interfaces 315 may include one or more wired or wireless network interface controllers (NICs) for communicating with a network, such as network 104 of FIG. 1. In some examples, functionality of processors 312 and/or memory 314 for processing data may be implemented as an SoC/SRAM integrated circuit component in accordance with the present disclosure. In some examples, memory 314 includes local memory (such as the local memory 154 with integral VSMEM 155, as shown in FIG. 1) and one or more of volatile and nonvolatile memory (such as volatile memory 160 and nonvolatile memory 162 of FIG. 1, respectively).

Software components executing within multitasking operating environment 317 of console 106 operate to provide an overall artificial reality application. In this example, the software components include application engine 320, rendering engine 322, gesture detector 324, pose tracker 326, and user interface engine 328.

In some examples, processors 302 and memory 304 may be separate, discrete components ("off-die memory"). In other examples, memory 304 may be on-die memory collocated with processors 302 within a single integrated circuit such as an SoC (such as shown in FIG. 1). In some examples, functionality of processors 302 and/or memory 304 for processing data may be implemented as an SoC/SRAM integrated circuit component in accordance with the present disclosure. In addition, memories 304 and 314 may include both on-die and off-die memory, with at least portions of the on-die memory being used to cache data stored in the off-die memory.

In some examples, optical system 306 may include projectors and waveguides for presenting virtual content to a user, as described above with respect to FIGS. 2A and 2B. For example, optical system 306 may include a projector including electronic display 303 and a projection lens.

In general, application engine 320 includes functionality to provide and present an artificial reality application, e.g., a teleconference application, a gaming application, a navigation application, an educational application, training or simulation applications, and the like. Application engine 320 may include, for example, one or more software packages, software libraries, hardware drivers, and/or Application Program Interfaces (APIs) for implementing an artificial reality application on console 106. Responsive to control by application engine 320, rendering engine 322 generates 3D artificial reality content for display to the user by application engine 340 of HMD 112.

Application engine 320 and rendering engine 322 construct the artificial content for display to user 110 in accordance with current pose information for a frame of reference, typically a viewing perspective of HMD 112, as determined by pose tracker 326. Based on the current viewing perspective, rendering engine 322 constructs the 3D, artificial reality content which may in some cases be overlaid, at least in part, upon the real-world 3D environment of user 110. During this process, pose tracker 326 operates on sensed data received from HMD 112, such as movement information and user commands, and, in some examples, data from any external sensors 90 (FIG. 1), such as external cameras, to capture 3D information within the real-world environment, such as motion by user 110 and/or feature tracking information with respect to user 110. Based on the sensed data, pose tracker 326 determines a current pose for the frame of reference of HMD 112 and, in accordance with the current pose, constructs the artificial reality content for communication, via the one or more I/O interfaces 315, to HMD 112 for display to user 110.

Pose tracker 326 may determine a current pose for HMD 112 and, in accordance with the current pose, triggers certain functionality associated with any rendered virtual content (e.g., places a virtual content item onto a virtual surface, manipulates a virtual content item, generates and renders one or more virtual markings, generates and renders a laser pointer). In some examples, pose tracker 326 detects whether the HMD 112 is proximate to a physical position corresponding to a virtual surface (e.g., a virtual pinboard), to trigger rendering of virtual content.

User interface engine 328 is configured to generate virtual user interfaces for rendering in an artificial reality environment. User interface engine 328 generates a virtual user interface to include one or more virtual user interface elements 329, such as a virtual drawing interface, a selectable menu (e.g., drop-down menu), virtual buttons, a directional pad, a keyboard, or other user-selectable user interface elements, glyphs, display elements, content, user interface controls, and so forth.

Console 106 may output this virtual user interface and other artificial reality content, via a communication channel 310, to HMD 112 for display at HMD 112.

In one example approach, gesture detector 324 analyzes the tracked motions, configurations, positions, and/or orientations of controller(s) 114 and/or objects (e.g., hands, arms, wrists, fingers, palms, thumbs) of the user to identify one or more gestures performed by user 110, based on the sensed data from any of the image capture devices such as image capture devices 138, 238 or 338, from controller(s) 114, and/or from other sensor devices (such as motion sensors 136, 206 or 336). More specifically, gesture detector 324 analyzes objects recognized within image data captured by motion sensors 336 and image capture devices 338 of HMD 112 and/or sensors 90 to identify controller(s) 114 and/or a hand and/or arm of user 110, and track movements of controller(s) 114, hand, and/or arm relative to HMD 112 to identify gestures performed by user 110. In some examples, gesture detector 324 may track movement, including changes to position and orientation, of controller(s) 114, hand, digits, and/or arm based on the captured image data, and compare motion vectors of the objects to one or more entries in gesture library 330 to detect a gesture or combination of gestures performed by user 110. In some examples, gesture detector 324 may receive user inputs detected by presence-sensitive surface(s) of controller(s) 114 and process the user inputs to detect one or more gestures performed by user 110 with respect to controller(s) 114.

As noted above, in some examples, memories 304 and 314 may include on-die and off-die memory. In some such examples, portions of the on-die memory may be used as local memory for on-die compute elements and, occasionally, as cache memory used to cache data stored in other on-die memory or in off-die memory. For example, portions of memory 314 may be cached in local memory associated with processors 312 when the local memory is available for caching. In some examples, memory 304 includes local memory (such as the local memory 154 with integral VSMEM 155, as shown in FIG. 1) and one or more of volatile and nonvolatile memory (such as volatile memory 160 and nonvolatile memory 162 of FIG. 1, respectively).

Figure 4:
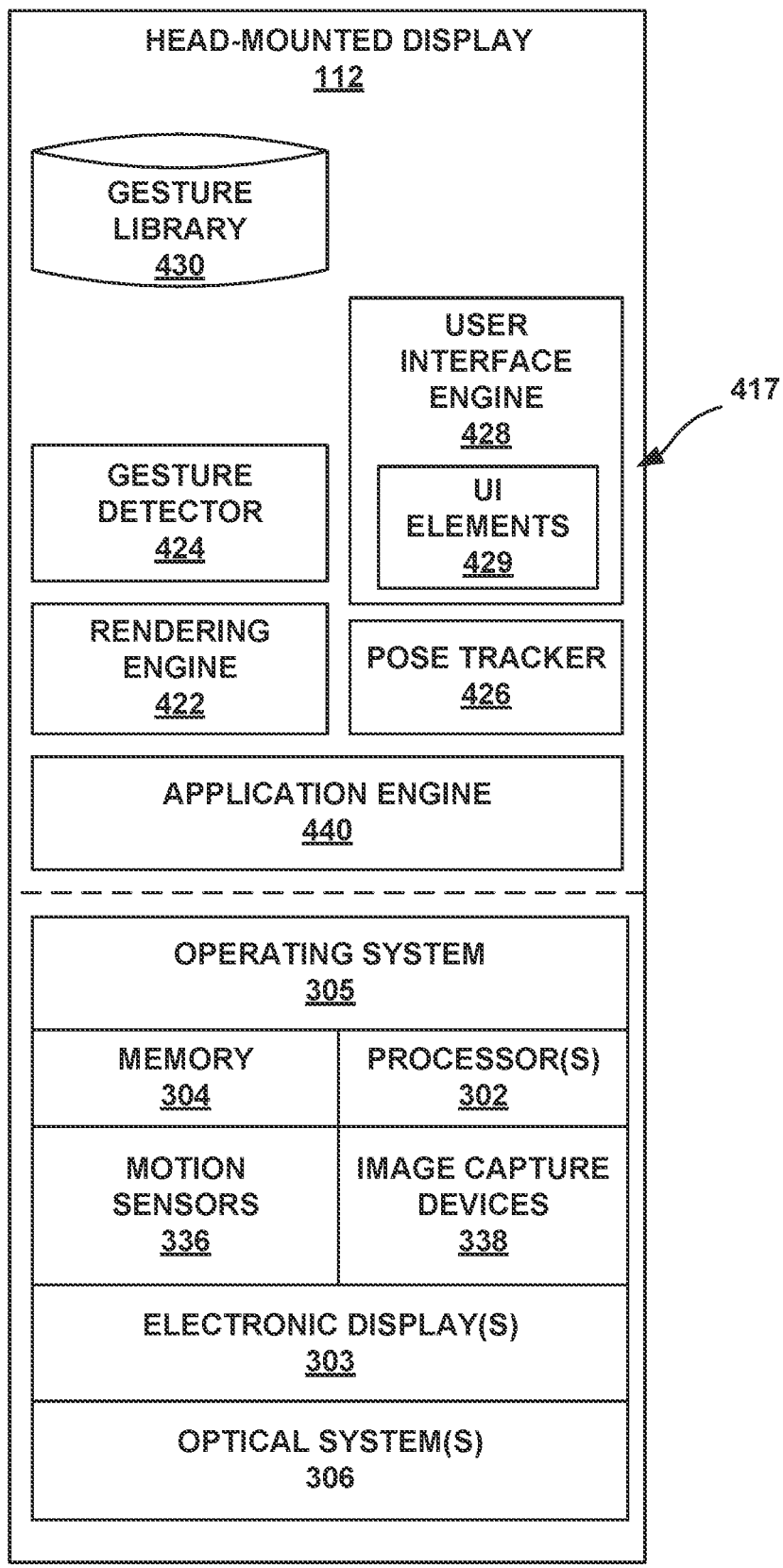
FIG. 4 is a block diagram depicting one example HMD of the artificial reality system of FIG. 1, in accordance with the techniques described in this disclosure.

FIG. 4 is a block diagram depicting one example HMD of the artificial reality system of FIG. 1, in accordance with the techniques described in this disclosure. In the example shown in FIG. 4, HMD 112 is a standalone artificial reality system. In this example, like FIG. 3, HMD 112 includes one or more processors 302 and memory 304 that, in some examples, provide a computer platform for executing an operating system 305, which may be an embedded, real-time multitasking operating system, for instance, or other type of operating system. In turn, operating system 305 provides a multitasking operating environment for executing one or more software components 417. Moreover, processor(s) 302 are coupled to electronic display(s) 303, varifocal optical system(s) 306, motion sensors 336, and image capture devices 338. In some examples, functionality of processors 302 and/or memory 304 for processing data may be implemented as an SoC integrated circuit component in accordance with the present disclosure. In one such example approach, each SoC includes two or more compute elements and memory distributed as local memory among specific compute elements but accessible to each of the other compute elements via a local memory caching mechanism, as detailed below. In some examples, memory 304 includes local memory (such as the local memory 154 with integral VSMEM 155, as shown in FIG. 1) and one or more of volatile and nonvolatile memory (such as volatile memory 160 and nonvolatile memory 162 of FIG. 1, respectively).

In some examples, optical system 306 may include projectors and waveguides for presenting virtual content to a user, as described above with respect to FIGS. 2A and 2B. For example, optical system 306 may include a projector including electronic display 303 and a projection lens. The projection lens may further include a multi-functional DOE that functions as both a grating coupler to redirect light into a waveguide and as a lens element improving the imaging quality of the projector lens.

In the example of FIG. 4, software components 417 operate to provide an overall artificial reality application. In this example, software components 417 include application engine 440, rendering engine 422, gesture detector 424, pose tracker 426, and user interface engine 428. In various examples, software components 417 operate similar to the counterpart components of console 106 of FIG. 3 (e.g., application engine 320, rendering engine 322, gesture detector 324, pose tracker 326, and user interface engine 328) to construct virtual user interfaces overlaid on, or as part of, the artificial content for display to user 110.

As discussed with response to user interface engine 328 of FIG. 3, in one example approach, user interface engine 428 is configured to generate virtual user interfaces for rendering in an artificial reality environment. User interface engine 428 generates a virtual user interface to include one or more virtual user interface elements 429, such as a virtual drawing interface, a selectable menu (e.g., drop-down menu), virtual buttons, a directional pad, a keyboard, or other user-selectable user interface elements, glyphs, display elements, content, user interface controls, and so forth.

As in the console 106 of FIG. 3, in the example HMD 112 of FIG. 4, gesture detector 424 analyzes the tracked motions, configurations, positions, and/or orientations of controller(s) 114 and/or objects (e.g., hands, arms, wrists, fingers, palms, thumbs) of the user to identify one or more gestures performed by user 110, based on the sensed data from any of the image capture devices such as image capture devices 138, 238 or 338, from controller(s) 114, and/or from other sensor devices (such as motion sensors 136, 206 or 336). In some examples, gesture detector 424 may track movement, including changes to position and orientation, of controller (s) 114, hand, digits, and/or arm based on the captured image data, and compare motion vectors of the objects to one or more entries in gesture library 430 to detect a gesture or combination of gestures performed by user 110.

In accordance with the techniques of the present disclosure, memory 304 of FIG. 4 may include both on-die and off-die memory, with at least portions of the on-die memory being used to cache data stored in the off-die memory. In some examples, portions of memory 304 in FIG. 4 may be cached in local memory associated with processors 302 when the local memory is available for caching, as will be discussed in further detail below. Processors 302 may include one or more accelerators. In some examples, memory 304 includes local memory (such as the local memory 154 with integral VSMEM 155, as shown in FIG. 1) and one or more of volatile and nonvolatile memory (such as volatile memory 160 and nonvolatile memory 162 of FIG. 1, respectively).

Figure 5:
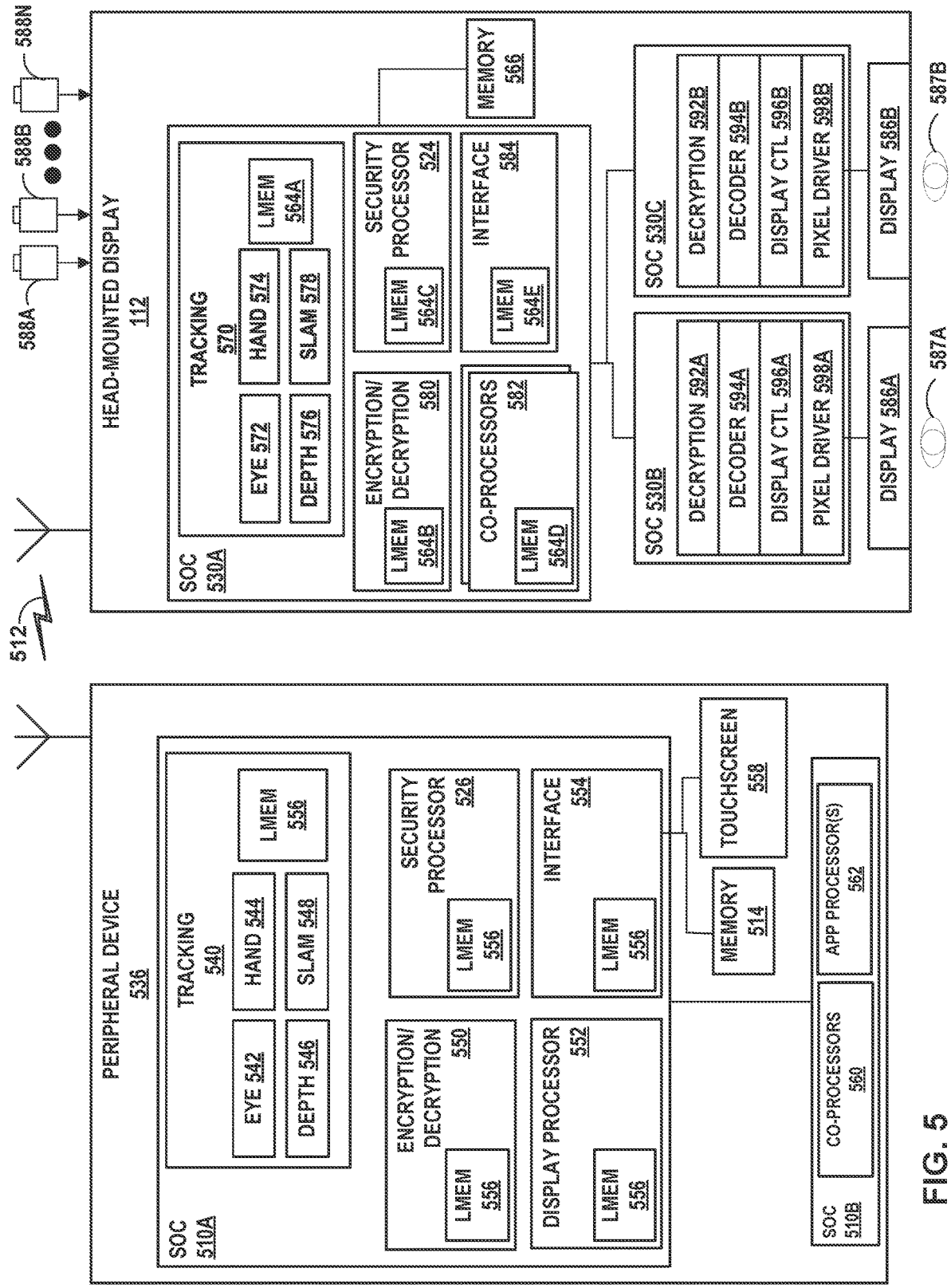
FIG. 5 is a block diagram illustrating an example implementation of a distributed architecture for a multi-device artificial reality system in which one or more devices are implemented using one or more SoCs within each device, in accordance with techniques described in this disclosure.

FIG. 5 is a block diagram illustrating an example implementation of a distributed architecture for a multi-device artificial reality system in which one or more devices are implemented using one or more SoCs within each device, in accordance with techniques described in this disclosure. FIG. 5 illustrates an example in which HMD 112 operates in conjunction with a peripheral device 536. As described above, HMD 112 is configured to operate with peripheral device 536 to enable the execution of artificial reality applications.

In the example of FIG. 5, peripheral device 536 represents a physical, real-world device having a surface on which multi-device artificial reality systems, such as systems 100, may overlay virtual content. Peripheral device 536 may include an interface 554 having one or more presence-sensitive surface(s) (such as touchscreen 558) for detecting user inputs by detecting a presence of one or more objects (e.g., a finger, a stylus, etc.) touching or hovering over locations of presence-sensitive surfaces. In some examples, peripheral device 536 may have a form factor similar to any of a smartphone, a tablet computer, a personal digital assistant (PDA), or other hand-held device. In other examples, peripheral device 536 may have the form factor of a smartwatch, a so-called "smart ring," or other such wearable device. Peripheral device 536 may also be part of a kiosk, console, or other stationary or mobile system. Interface 554 may incorporate output components, such as touchscreen(s) 558, for outputting touch locations or other visual content to a screen. However, not all examples of peripheral device 536 include a display.

In the example of FIG. 5, HMD 112 and peripheral device 536 include SoCs 530A-530C and 510A-510B, respectively. SoCs 530A and 510A represent a collection of specialized integrated circuits arranged in a distributed architecture and configured to provide an operating environment for artificial reality applications. As examples, SoC integrated circuits may include a variety of compute elements. The compute elements may include specialized functional blocks operating as co-application processors, sensor aggregators, encryption/decryption engines, security processors, hand/eye/depth tracking and pose computation elements, video encoding and rendering engines, display controllers and communication control components. Some or all these functional blocks may be implemented as subsystems that include local memory such as LMEM 556 or 564. In one example approach, each SoC (510A, 510B, and 530A-530C) in FIG. 5 includes two or more compute elements and memory distributed as local memory among specific compute elements but accessible to each of the other compute elements via a local memory caching mechanism, as detailed below. FIG. 5 is merely one example arrangement of SoC integrated circuits. The distributed architecture for a multi-device artificial reality system may include any collection and/or arrangement of SoC integrated circuits.

In the example of FIG. 5, HMD 112 includes SoCs 530A, 530B and 530C in accordance with the techniques of the present disclosure. In the example shown, SoC 530A includes local memories LMEM 564A-564E (collectively, "LMEM 564"), in some examples SRAM but other types of memory may be used. In some example approaches, LMEM 564 may be separated or external (e.g., not on-die) from the processor(s) and other on-die circuitry of SoC 530A. Peripheral device 536, in this example, is implemented using a traditional SoC architecture, in which SoC 510A includes an on-die LMEM 556 that may be distributed across subsystems of SoC 510A, and external (off-die) memory 514, which may include volatile and/or non-volatile memory. In one example, HMD 112 includes a memory 566, which may include volatile and/or non-volatile memory, and which may be off die. In one example, portions of memory 566 may be cached in LMEM 564 when the various LMEM 564 are available for caching. Similarly, also in accordance with the techniques of the present disclosure, portions of memory 514 may be cached in LMEM 556 when the various LMEM 556 are available for caching. In some examples, memories 556 and 564 include local memory (such as the local memory 154 with integral VSMEM 155, as shown in FIG. 1). In some examples, LMEM 564 includes local memory (such as the local memory 154 with integral VSMEM 155, as shown in FIG. 1) connected to memory 566, with memory 566 including one or more of volatile and nonvolatile memory (such as volatile memory 160 and nonvolatile memory 162 of FIG. 1, respectively). In some examples, LMEM 556 includes local memory (such as the local memory 154 with integral VSMEM 155, as shown in FIG. 1) connected to memory 514, with memory 514 including one or more of volatile and nonvolatile memory (such as volatile memory 160 and nonvolatile memory 162 of FIG. 1, respectively).

Head-mounted displays, such as the HMD 112 described herein, benefit from the reduction in size, increased processing speed and reduced power consumption provided by using on-chip memory such as LMEM 564 in SoC 530A. For example, the benefits provided by the SoC 530A in accordance with the techniques of the present disclosure may result in increased comfort for the wearer and a more fully immersive and realistic AR/VR experience.

In addition, it shall be understood that any of SoCs 510 and/or 530 may be implemented using an SoC with integrated memory in accordance with the techniques of the present disclosure, and that the disclosure is not limited in this respect. Any of the SoCs 510 and/or 530 may benefit from the reduced size, increased processing speed and reduced power consumption provided by the SoC/SRAM integrated circuit described herein. In addition, the benefits provided by the SoC/SRAM component in accordance with the techniques of the present disclosure are not only advantageous for AR/VR systems but may also be advantageous in many applications such as autonomous driving, edge-based artificial intelligence, the Internet-of-Things (IoT), and other applications which require highly responsive, real-time decision-making capabilities based on analysis of data from a large number of sensor inputs.

In the example of FIG. 5, SoC 530A of HMD 112 comprises functional blocks including security processor 524, tracking 570, encryption/decryption 580, co-processors 582, and an interface 584. Tracking 570 provides a functional block for eye tracking 572 ("eye 572"), hand tracking 574 ("hand 574"), depth tracking 576 ("depth 576"), and/or Simultaneous Localization and Mapping (SLAM) 578 ("SLAM 578"). Some or all these functional blocks may be implemented within one or more subsystems of SoC 530A. As an example of the operation of these functional blocks, HMD 112 may receive input from one or more accelerometers (also referred to as inertial measurement units or "IMUs") that output data indicative of current acceleration of HMD 112, GPS sensors that output data indicative of a location of HMD 112, radar or sonar that output data indicative of distances of HMD 112 from various objects, or other sensors that provide indications of a location or orientation of HMD 112 or other objects within a physical environment. HMD 112 may also receive image data from one or more image capture devices 588A-588N (collectively, "image capture devices 588"). Image capture devices 588 may include video cameras, laser scanners, Doppler radar scanners, depth scanners, or the like, configured to output image data representative of the physical environment. More specifically, image capture devices 588 capture image data representative of objects (including peripheral device 536 and/or hand) in the physical environment that are within a field of view of image capture devices, which typically corresponds with the viewing perspective of HMD 112. Based on the sensed data and/or image data, tracking 570 determines, for example, a current pose for the frame of reference of HMD 112 and, in accordance with the current pose, renders the artificial reality content.

Encryption/decryption 580 of SoC 530A is a functional block to encrypt outgoing data communicated to peripheral device 536 or to a security server and decrypt incoming data communicated from peripheral device 536 or from a security server. Coprocessors 582 include one or more processors for executing instructions, such as a video processing unit, graphics processing unit, digital signal processors, encoders and/or decoders, and applications such as AR/VR applications.

Interface 584 of SoC 530A is a functional block that includes one or more interfaces for connecting to memory 514 and to functional blocks of SoC 530B and/or 530C. As one example, interface 584 may include peripheral component interconnect express (PCIe) slots. SoC 530A may connect with SoC 530B and 530C using interface 584. SoC 530A may also connect with a communication device (e.g., radio transmitter) using interface 584 for communicating via communications channel 512 with other devices, e.g., peripheral device 536.

SoCs 530B and 530C of HMD 112 each represents display controllers for outputting artificial reality content on respective displays, e.g., displays 586A, 586B (collectively, "displays 586"). In this example, SoC 530B may include a display controller for display 586A to output artificial reality content for a left eye 587A of a user. As shown in FIG. 5, SoC 530B may include a decryption block 592A, decoder block 594A, display controller 596A, and/or a pixel driver 598A for outputting artificial reality content on display 586A. Similarly, SoC 530C may include a display controller for display 586B to output artificial reality content for a right eye 587B of the user. As shown in FIG. 5, SoC 530C may include decryption 592B, decoder 594B, display controller 596B, and/or a pixel driver 598B for generating and outputting artificial reality content on display 586B. Displays 568 may include Light-Emitting Diode (LED) displays, Organic LEDs (OLEDs), Quantum dot LEDs (QLEDs), Electronic paper (E-ink) displays, Liquid Crystal Displays (LCDs), or other types of displays for displaying AR content.

As shown in FIG. 5, peripheral device 536 may include SoCs 510A and 510B configured to support an artificial reality application. In this example, SoC 510A comprises functional blocks including security processor 526, tracking 540, encryption/decryption 550, display processor 552, and interface 554. Tracking 540 is a functional block providing eye tracking 542 ("eye 542"), hand tracking 544 ("hand 544"), depth tracking 546 ("depth 546"), and/or Simultaneous Localization and Mapping (SLAM) 548 ("SLAM 548"). Some or all these functional blocks may be implemented in various subsystems of SoC 510A. As an example of the operation of SoC 510A, peripheral device 536 may receive input from one or more accelerometers (also referred to as inertial measurement units or "IMUs") that output data indicative of current acceleration of peripheral device 536, GPS sensors that output data indicative of a location of peripheral device 536, radar or sonar that output data indicative of distances of peripheral device 536 from various objects, or other sensors that provide indications of a location or orientation of peripheral device 536 or other objects within a physical environment. Peripheral device 536 may in some examples also receive image data from one or more image capture devices, such as video cameras, laser scanners, Doppler radar scanners, depth scanners, or the like, configured to output image data representative of the physical environment. Based on the sensed data and/or image data, tracking block 540 determines, for example, a current pose for the frame of reference of peripheral device 536 and, in accordance with the current pose, renders the artificial reality content to HMD 112.

In another example approach, tracking block 570 determines the current pose based on the sensed data and/or image data for the frame of reference of peripheral device 536 and, in accordance with the current pose, renders the artificial reality content relative to the pose for display by HMD 112.

In one example approach, encryption/decryption 550 of SoC 510A encrypts outgoing data communicated to HMD 112 or security server and decrypts incoming data communicated from HMD 112 or security server. Encryption/ decryption 550 may support symmetric key cryptography to encrypt/decrypt data using a session key (e.g., secret symmetric key). Display processor 552 of SoC 510A includes one or more processors such as a video processing unit, graphics processing unit, encoders and/or decoders, and/or others, for rendering artificial reality content to HMD 112. Interface 554 of SoC 510A includes one or more interfaces for connecting to functional blocks of SoC 510A. As one example, interface 584 may include peripheral component interconnect express (PCIe) slots. SoC 510A may connect with SoC 510B using interface 584. SoC 510A may connect with one or more communication devices (e.g., radio transmitter) using interface 584 for communicating with other devices, e.g., HMD 112.

SoC 510B of peripheral device 536 includes co-application processors 560 and application processors 562. In this example, co-processors 560 include various processors, such as a vision processing unit (VPU), a graphics processing unit (GPU), and/or central processing unit (CPU). Application processors 562 may execute one or more artificial reality applications to, for instance, generate and render artificial reality content and/or to detect and interpret gestures performed by a user with respect to peripheral device 536. In one example approach, both co-processors 560 and application processors 562 include on-chip memory (such as LMEM 556). Portions of memory 514 may be cached in LMEM 556 when the various LMEM 556 are available for caching.

As noted above, there is considerable power savings that can be had by selectively adding lossless compression to SMEM allocated for activation data within LMEM 564. In some applications, the addition of lossless compression is one way to further reduce power, as it can be designed to be transparent to applications such as the training of machine learning. In general, however, lossless compression cannot guarantee the amount of compression. Therefore, in some example approaches, lossless compression is used in conjunction with the virtualization of activation data SMEM to store the most recently used activation data in VSMEM and to store the least recently used activation data in memory 514 or memory 566. Virtualization of the activation data SMEM alone leads to a significant reduction in the bandwidth required to transfer activation data to off-die memory 514 or 566; the reduction is even greater when lossless compression is used to compress the data stored in VSMEM.

One advantage of virtualizing activation data SMEM in local memory 556 and 564 is that one may allocate a large virtual memory assuming no compression but only allocate local memory to activation data SMEM based on average compression. This will result in lower power consumption on average without wasting SMEM.

A variety of compression algorithms were considered for use in compressing activation data. DEC400 is a compression algorithm designed to compress image data where the neighboring pixels have almost the same values. This is not the case with activation data where the data is sparse. With sparse activation data (~50-60% zeros), DEC400 provides only about a 10% data saving. Another problem with DEC400 is that efficient use SMEM requires that the data be stored in a packed format. DEC400 produces non packed data; resolving this problem may entail dealing with sub-blocks that are individually compressed and then packed, requiring a separate packing operation to be performed on the compressed subblocks. It may also require the addition of a header for unpacking.

Another option is to use a data compression algorithm such as RFC1951 Inflate and Deflate to perform activation data compressions. This will also create a variable sized output after compression. Here again the use of virtual memory is beneficial since one may allocate a large virtual memory, but only physically pin part of the memory based on an expected average compression. Initial evaluation of the impact of, e.g., ZIP and GZIP, on activation data indicates compression ratios of approximately 2-3:1 for typical datasets, but the number may vary based on block size and Huffman table constraints.

In one example, a compression algorithm is selected that limits the impact on latency of fetching data from memories 514 and 566. A machine learning compiler attempts to optimize the tensors kept in local memory and those it evicts. This is mostly done keeping reuse distance (time) in mind. Tensors stored in local memory will generally be extremely latency sensitive, as it impacts throughput. Therefore, in some example approaches, a very small block compression algorithm or other scheme which does not impact latency is used. Lossless compression algorithms such as run length encoding (RLE) or RLE with mask is less useful since such schemes do not save on LMEM space (one cannot guarantee the compression ratio). Instead, it may be better to use a lossy compression scheme which does not adversely impact machine learning accuracy and latency.

In one example approach, a block level compression scheme is used to compress tensors that have been evicted from local memory of the compute element training the machine learning model (evicted tensors have a larger reuse distance). This lossless compression may be used in conjunction with virtualization to "increase" the apparent size of on-die SRAM allocated as VSMEM 155. In one such example approach, GZIP is used to compress and decompress the data evicted from VSMEM 155. GZIP would be overkill if being used only for activation and weight compression, but in some example approaches, the compression used is designed as a generic lossless compression that may be used by other applications as a shared resource.

In one example approach, two kinds of compression are used in SoC 530, one inside the compute element training the machine learning model and a second one for the system in general. In one such example approach, SoC 530 includes two external IP blocks (such as blocks available, for instance, from CAST, Inc. of Woodcliff Lake, NJ, that implement a high-performance devoted RFC-1950/1951/1952 encode and decode operation on a configured block size with a search window of up to 4 KBytes. In one example approach, the blocks are integrated as standalone accelerator engines with Advanced eXtensible Interface (AXI) or Advanced High-Performance Bus (AHB) ports. For static Huffman tables, latency is expected to be about 20 cycles for the decode operation. In addition, since it is expected that the most correlated data patterns in activations are run-lengths of zeros, a dedicated RLE/VLC (Run-Length-Encoder/Variable-Length-Coder) for compressing just zero-runs may yield the most energy-efficient method for compressing such data.

Figure 6:
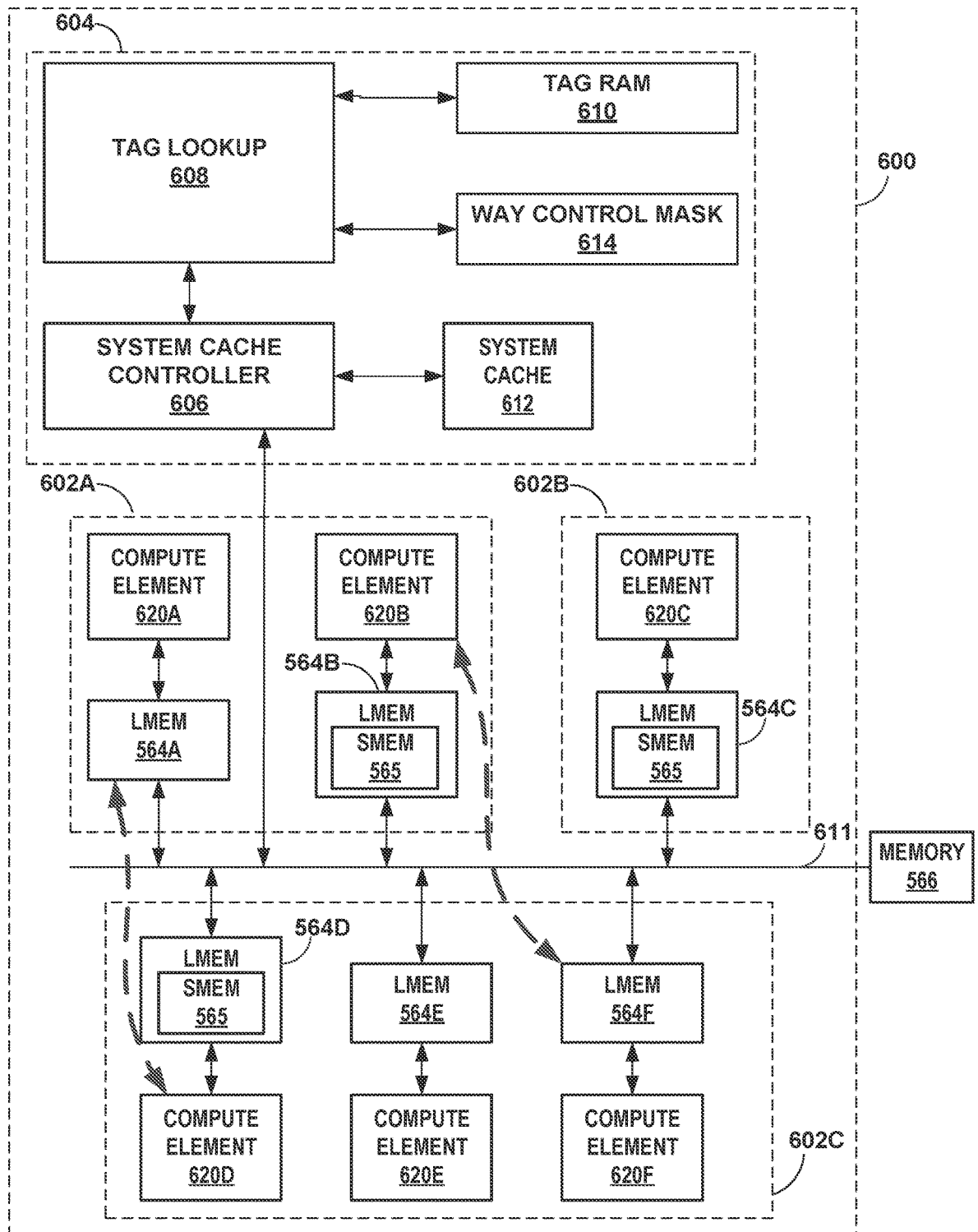
FIG. 6 is a block diagram illustrating an example cache in a distributed memory system, in accordance with techniques described in this disclosure.

FIG. 6 is a block diagram illustrating an example cache in a distributed memory system, in accordance with techniques described in this disclosure. The example shown in FIG. 6 illustrates a System on Chip (SoC) 600 having three subsystems 602A-602C (collectively "subsystems 602") and a distributed cache controller 604. In the example shown, distributed cache controller 604 includes a system cache controller 606, a centralized TAG lookup 608, a TAG RAM 610 and a way control mask 614; the cache memory is distributed among local memory 564 in the subsystems 602 of SoC 600. In some example approaches, a portion of local memory 564 may be allocated as activation data SMEM 565, as described above. In some example approaches, the allocated SMEM 565 is configured as VSMEM.

In the example shown in FIG. 6, a compute element 620 is connected to local memory 564 and has access via distributed cache controller 604 to cache memory blocks stored in local memory 564 of other compute elements 620. Subsystems 602, cache controller 604, and memory 566 may be connected via a Network-on-Chip (NoC) 611. In one example, NOC 611 is a network-based communications system that implements a router-based packet switching network on-die between subsystems 702.

In one example, cache controller 604 controls the access to LMEMs 564 from outside of the subsystems 602. In the example shown in FIG. 6, compute element 620B has allocated an SMEM 565 in the local memory 564B, compute element 620C has allocated an SMEM 565 in the local memory 564C, and compute element 620D has allocated an SMEM 565 in the local memory 564D. Each SMEM 565 is used to store portions of a data set, such as activation data, that overflow the corresponding local memory 564. For instance, in one example, compute element 520B executes a program training a machine learning model, and activation data that would normally spill to memory 566 is captured in the SMEM 565 of LMEM 564B instead.

In one example approach, distributed cache controller 604 is an N-way set-associative cache. In a set-associative cache, there are a fixed number of locations where each block to be cached may be stored. That fixed number of locations are elements in a set; an N-way set-associative cache includes a number of sets, each of which includes N locations for storing data blocks. Each block in the memory maps to a unique set in the cache given by the index field. A block (cache line) may be placed in any location in the set. To access a cache line, all blocks in the set corresponding to the cache line are searched for a match. That is, in the example shown in FIG. 6, the Tag RAM 610 associated with the set is searched across multiple ways. If a match is found at one of the locations in the set, the data has been cached and may be accessed by a compute element 620.

In one example approach, the M most significant bits of an address form the tag, while the next S bits select the set associated with the address. The least significant bits of the address select data from within the block. Such an approach takes advantage of the principle of spatial locality in memory requests. Other combinations of nonoverlapping address bits may also be used for the tag, set and block address bits.

In one example approach, sets of cache locations are allocated to particular sections of local memory 564, with all locations in the set placed in a single local memory 564. The different sets may, however, be distributed across two or more local memories 564. Tags and indices associated with cached blocks of data are stored in tag RAM 610.

In operation, in a read operation, a read request is received by system cache controller 606. The system cache controller 606 sends the set number and tag of the address of the read request to tag lookup 608, which accesses tag RAM 610 to determine if the block associated with the address is in cache. If so, tag lookup 608 returns a cache hit, and the location in the set where the cache line is stored. The read request is then fulfilled from the cache distributed between system cache 612 and one or more LMEM 564. That is, the read request is fulfilled from either the main system cache 612 or from one of the local memories 564 in the different compute units 602.

If, however, the block associated with the read request is not in cache, tag lookup 608 signals a cache miss and the read request is sent to memory 566 for fulfillment. A read miss brings back a cache line, fulfils the read request, and stores the cache line in a local memory 564 in one of the locations in the set associated with the read request address. In one example approach, the location selected from the set of locations is selected randomly. In another example approach, the location selected from the set of locations is the location that has not been accessed for the longest time. Other replacement algorithms may be used as needed.

In one example approach, each cache line has attributes that indicate whether the cache line has been modified (e.g., dirty cache line bits). In one such example approach, the dirty bits are stored with the tag in tag RAM 610. When a cache line is replaced, only cache lines with dirty bits are written back to memory 566. As an example, assume that an entire data section is resident in the cache as a set of cache lines. Instead of having to copy the entire data section to memory, only the dirty cache lines are copied to memory 566 on a transition.

As shown in FIG. 6, distributed cache controller 604 includes a system cache 612 used to store cache lines separate of local memories 564. In one such approach, cache controller 606 determines whether a particular way or set is located in the main system cache 612 or in the local memory 564 in one of the subsystems 602. In one example approach, cache controller 606 accesses the tag lookup 608 as usual and, if the data corresponding to the address has been cached, then cache controller 606 determines if the cache line is in the main system cache 612 or in the local memory 564 in one of the subsystems 602 and proceeds accordingly.

It can be advantageous to use a local memory 564 to store cache lines when the local memory is not being used by the local compute elements 620. There is, for example, a temporal nature to local memory use when executing certain applications. The temporal nature of such use may be used to gain additional storage for cache lines in times when the memory is not being used by its associated compute element 620.

In one example, when compute element 620B is executing an application in local memory 564B, the set associative cache is configured to disable from caching sets of the cache normally mapped to the local memory 564B, and when the compute element 620C is executing an application in local memory 564C, the set associative cache is configured to disable from caching sets of the cache normally mapped to the local memory 564C. On the other hand, as shown in FIG. 6, compute element 620B may access cache blocks temporarily stored, for example, in local memory 564F while using the LMEM 564B not allocated as SMEM 565 to store program code and application data. Similarly, compute element 620D may access cache blocks temporarily stored, for example, in local memory 564A while using the LMEM 564D not allocated as SMEM 565 to store program code and application data.

In one example approach, sets of cache locations are assigned to specific local memories 564 and are only available for caching when the local memory 564 associated with the set is available for caching. In one such example approach, way control mask 614 includes an entry for each set which indicates whether a set is available for caching. Temporal use of local memory as cache is further detailed in DISTRIBUTED TEMPORAL CACHE FOR SYSTEMS ON CHIP, U.S. patent application Ser. No. 17/504,292, filed Oct. 18, 2021, the description of which is incorporated herein by reference.

Figure 7:
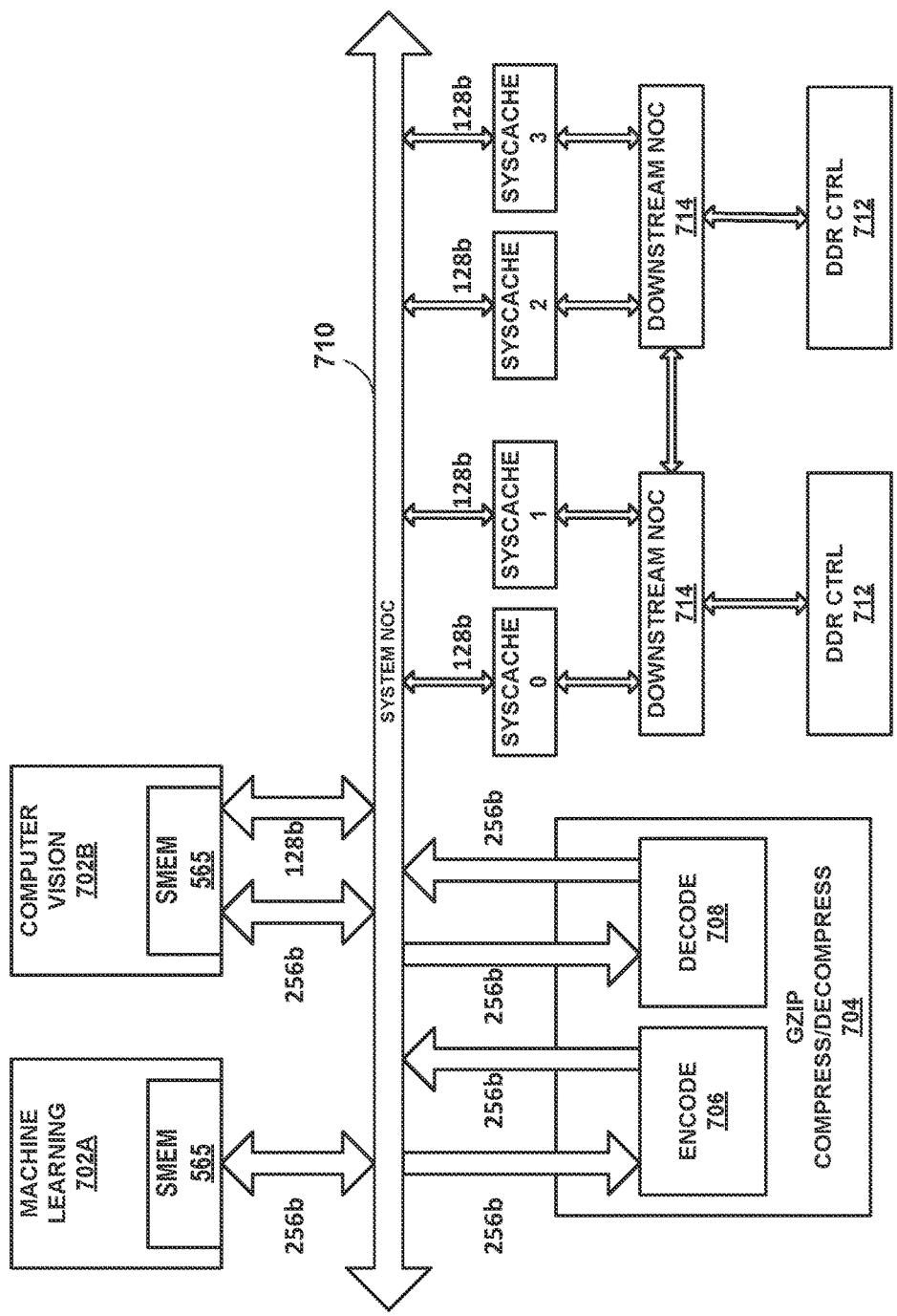
FIG. 7 is a block diagram illustrating an SoC having an example distributed memory system that uses lossless compression and virtualization to reduce power in the SoC, in accordance with techniques described in this disclosure.

FIG. 7 is a block diagram illustrating an SoC having an example distributed memory system that uses lossless compression and virtualization to reduce power in the SoC, in accordance with techniques described in this disclosure. In the example of FIG. 7, a compute element executing a machine learning algorithm in subsystem 702A attempts to store activation spills in an activation data SMEM 565 in local memory associated with the compute element of subsystem 702A. In addition, a compute element executing a computer vision algorithm in subsystem 702B attempts to store data spills in an activation data SMEM 565 in local memory associated with the compute element of subsystem 702B. The destination where the spill is stored, however, may be either SMEM 565 or memory 566.

As noted above, in some example approaches, SMEM 565 is virtualized as VSMEM, and the activation data is compressed. SMEM redirection is therefore used to direct writes of activation data initially directed to SMEM 565 to compression block 704 for compression. The compressed data is then forwarded to either SMEM 565 of local memory of the appropriate subsystem or to off-die memory 566 via DDR CTRL 712. As shown in FIG. 7, data to be written to memory 566 may be stored temporarily in a system cache (one of SYSCACHEs 0:3) before being transmitted via downstream NoC 714 to the appropriate section of memory 566.

In one example approach, the machine learning training program of subsystem 702A determines that the program is going to spill data to SMEM 565. The program instead redirects the spill to GZIP compress/decompress 704 using system NoC 710. Although FIG. 7 shows the use of GZIP, other lossless compression algorithms may be used.

In one example approach, the compression block is 4 KB and the compressed block of data is forwarded to VSMEM after address translation. In one example approach, the blocks are written at 4 KB offset in a virtual SMEM (VSMEM) space.

In one example approach, only a portion of VSMEM is physically pinned to SMEM 565 of on-die local memory 564. The amount pinned may be a function of the expected amount of lossless compression. For instance, one might allocate SMEM 565 based on average compression of 2:1.

In such an example, VSMEM would have a backend store in LPDDR for cases where the 2 KB of physical SMEM 565 on-die is not sufficient.

Figure 8:
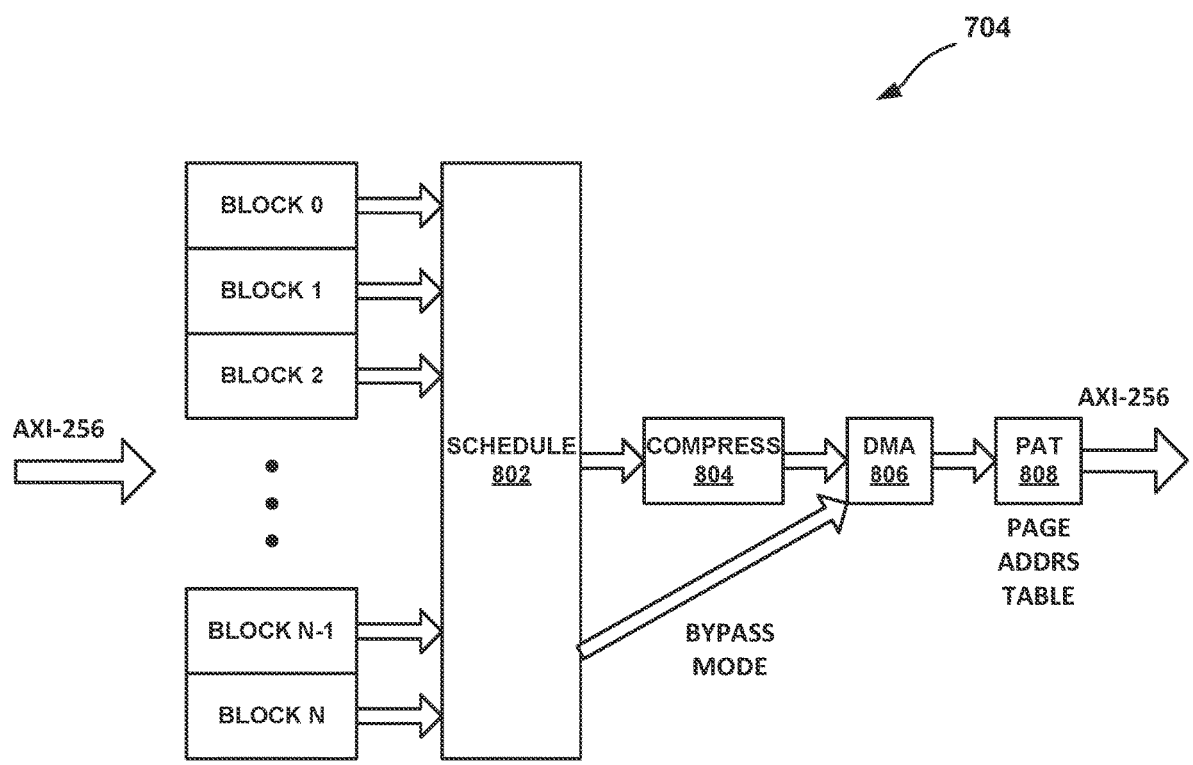
FIG. 8 is a block diagram illustrating compression in the compression block of FIG. 7, in accordance with techniques described in this disclosure.

FIG. 8 is a block diagram illustrating compression in the compression block of FIG. 7, in accordance with techniques described in this disclosure. In the example shown in FIG. 8, 64 KB buffers are used as staging areas for the different subsystems 602 to write data to create blocks.

In the example shown in FIG. 8, access to the compression block 804 is through a memory aperture (memory port) using 256-bit wide Advanced eXtensible Interface (AXI). Access to this region goes through compression block 704, although, in some example approaches, there may be an additional aperture used for uncompressed data. Uncompressed data may in some example approaches be a pass through (bypass mode in FIG. 8). That is, the data would go in and out of block 704 uncompressed. An advantage of using compression block 704 in bypass mode for uncompressed data is that compression block 704 can virtualize the SMEM, computer vision and audio LMEMs via the Page Map table (PAT) located inside of compression block 704. This is not possible with the SMEM/Cache block only as it cannot redirect traffic out of it and the virtualization is limited to VSMEM. The ability to virtualize a larger memory space allows compute elements 620 such as machine language training programs to offload tensors from local memory 564 to various memories on-die without worrying about the physical location of the memory. The result is access to more on-die SRAM and to further power savings.

In one example approach, a scheduler 802 reads data from one of the blocks and streams the data to compression block 804. In one such example approach, compression block 804 is a ZipAccel-C core available from CAST, Inc. of Woodcliff Lake, NJ. The core is a custom hardware, configurable and scalable implementation of the lossless data compression algorithm commonly referred to as Gzip, as described by RFC1950 (zlib), RFC1951(deflate) and RFC1952 (gzip). The ZipAccel-C core compresses data streams, referring to blocks of data as "files". In the context of machine learning, tensors that are getting evicted from local memory 564 may be "files," although they are termed "blocks" in this document. In some example approaches, compression block 804 is based on an implementation of Zstandard (ZSTD), a lossless compression algorithm developed at Facebook. In general, any type of lossless compression may be used.

CAST's ZipAccel-C uses a AXI streaming interface and requires explicit signaling of the start and end of a block to compress. In one example approach, two AXI_USER_BITS [7:6] are used to indicate the start and end of a tensor. This is done by the compute element performing the ML training. Since there is an explicit signaling mechanism to indicate the start and end of a block, the unrolling of the 3-D tensor to a 1D tensor may occur in any C, H, W dimension. It should also be possible to have the compute element performing the ML model training to evict multiple tensors simultaneously. The different tensors would be indicated by different AXI_IDs.

Computer vision algorithms may also partition data into blocks: a tile or some linear region such as a line or multiple lines for instance. In one example approach, the compute element executing the computer vision algorithm would use a similar signaling mechanism as described for tensors above. Different clusters in the compute element could evict blocks independently and use different AXI_IDs so that the compression subsystem can distinguish the blocks.

As shown in FIG. 8, compression block 706 may require the use of buffers as staging areas for the different subsystems to write data to create blocks. In one example approach, each block is a fixed size. such as 4 KB; this would represent the largest block size and, for machine learning applications, would correspond to the largest tensor size.

In another example approach, one may use a few more AXI_USER bits to signal the size of the block (or to select between a few sizes). Such an approach would provide a more flexible buffer allocation scheme.

A second issue is the number of simultaneous blocks that need to be supported, as this will determine the buffer size. In one example approach, one can fix the buffer size to 64 KB and, if there is no buffer space available, simply pass through the data to the output as uncompressed data.

In one example approach, the output from compression block 804 is sent to on-die VSRAM allocated as SMEM or to SRAM designated as local memory. This can be done by defining a memory region (20 MB) that compression block 804 will respond to; the input address is mapped to the output virtual address and translates to a physical address.

Figure 9:
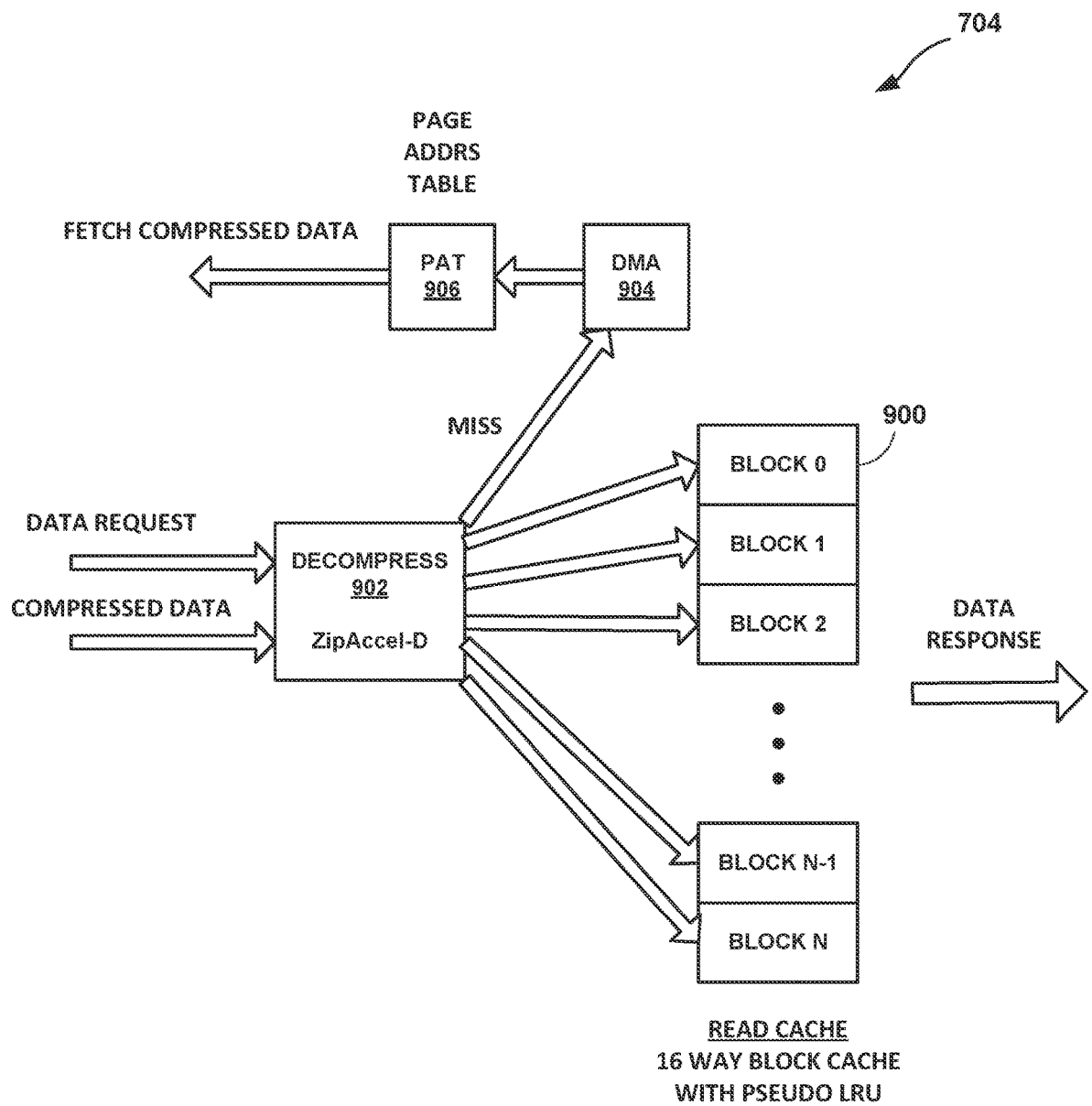
FIG. 9 is a block diagram illustrating decompression in the compression block of FIG. 7, in accordance with techniques described in this disclosure.

FIG. 9 is a block diagram illustrating decompression in the compression block of FIG. 7, in accordance with techniques described in this disclosure. In the example shown in FIG. 9, compression block 704 includes a 16-way block cache 900 with a pseudo least recently used (LRU) replacement policy. In one example approach, block size is 4 KB and the data stored is not compressed. A data request is received at decompression block 902 and decompression block 902 determines if the data requested is in cache 900. If so, the uncompressed data is sent out in response to the request.

If, however, the data requested is not in cache, decompression block 902 requests the data from DMA 904. DMA generates the appropriate address, which is modified by the page address table 906 and the data requested is fetched from a portion of LMEM 564 representing physical address space for VSMEM 155 or from corresponding of-die memory 566 and sent to decompression block 902. Decompression block 902 decompresses the compressed data and sends the decompressed data in response to the read request.

Figure 10:
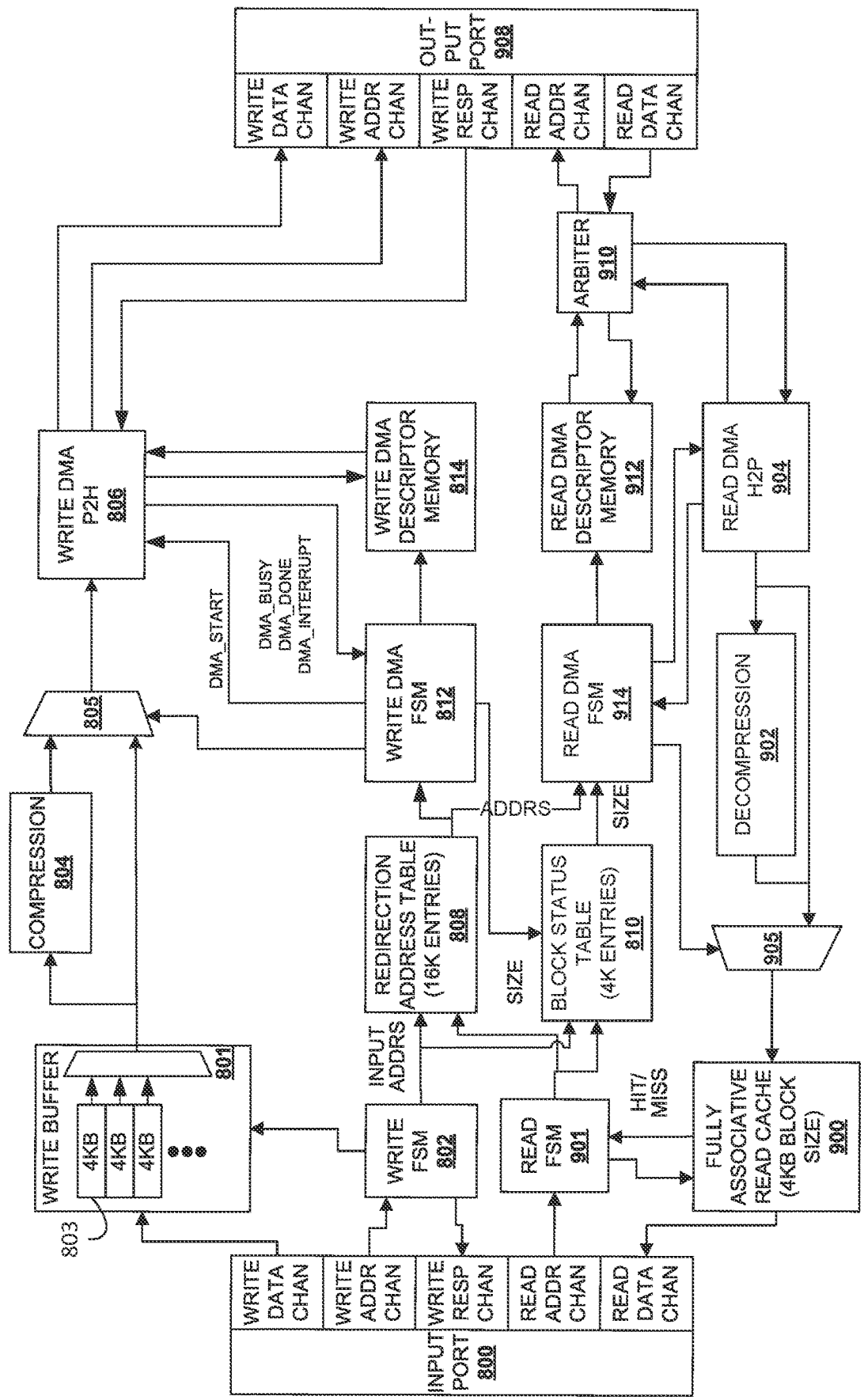
FIG. 10 is a more detailed block diagram of the compression block of FIG. 7, in accordance with techniques described in this disclosure.

FIG. 10 is a more detailed block diagram of the compression block of FIG. 7, in accordance with techniques described in this disclosure. In the example approach of FIG. 10, as shown at point 1, an input port 800 receives activation data to be stored in a virtual SMEM (1). The write data received at the Write Data Channel of input port 800 is stored in a write buffer 801 having write buffer blocks 803 sized to support multiple transactions. In one such example approach, blocks 803 are 4 KB in size and are tracked based on an AXI identifier (AXI ID). A write address received on the Write Data Channel of input port 800 is forwarded to Redirection Address Table 808 and Block Status Table 810.

In one example approach, as shown at point 2, compression block 704 includes a bypass multiplexer 805 that may be used if the data cannot or should not be compressed, or if write buffer 801 is full.

As in FIG. 8, in the example approach of FIG. 10, scheduler 802 selects an appropriate block to transfer to compression block 804. In one example approach, scheduler 802 operates in two modes: streaming mode and collect mode. In streaming mode, Write FSM (scheduler) 802, on receiving a transfer from an initiator, immediately passes the data on to compression block 804 for compression. In collect mode, scheduler 802 waits until a block is collected and the initiator (e.g., the compute element generating the activation data) has signaled, via AXI user bits, to begin compression.

In both modes, scheduler 802 provides a write response to the initiator of the write request on the Write Response Channel of input port 800.

In the example approach of FIG. 10, at point 3, write DMA FSM 812 initiates a DMA transfer to write into physical memory through output port 908. Write DMA 806 responds by transferring a block of write data through the Writes Data Channel of output port 908 to memory 566 and a write address through Write Address Channel of output port 908 and receives a write response from output port 908 on the Write Response Channel when the write is complete. In one such example approach, the write DMA is programmed through a descriptor chain in Write DMA Descriptor memory 814, such as the write descriptor chain shown in FIG. 11. One reason to keep the descriptor chains locally in Write DMA Descriptor memory 814 is to reduce latency.

In one example approach, as shown at point 4, Redirection Address Table 808 maps the 4 KB aligned input address (16 MB aperture) into 4×1 KB aligned physical addresses. Block Status Table 810 tracks if a 4 KB block is compresses and the size of the block.

Multiple reads are supported. In one example approach, read cache 900 is sized to support a 4 KB of data for each supported incoming transaction. At point 5 of FIG. 10, Read FSM 901 checks cache 900 to see if data is already available in read cache 900. If not Read FSM 901 allocates space in Read Cache 900 for a read and issues a read request via Read DMA FSM 914 to physical memory via the Write Address Channel of output port 908. In one such approach, Read DMA FSM 914 retrieves the compressed data, decompresses the data at decompression block 902 and stores the decompressed retrieved data in Read Cache 900. If the data read is not compressed, Read DMA FSM bypasses decompression block 902 via multiplexer 905, as shown at point 6.

In one example approach, a subsystem requests a block of compressed data via a read to its virtual SMEM address. On a miss to Read Cache 900, the decompressor fetches the compressed block from SMEM using a page address table to convert the virtual SMEM address to a physical address. The physical address is then used to fetch the compressed block from physical memory. Once the compressed data is received, it gets decompressed and written to a block in read cache 900. If there is a free block, the block is written to the free block. If there is no free block, the new block overwrites a block belonging to a victim, where pseudo LRU is used to pick the victim.

In one example approach, as shown at point 7, Read DMA 904 operates similarly to Write DMA 806, except that it issues physical addresses. For example, Read DMA 904 also is programmed via descriptor chains as shown in FIG. 11.

Figure 11:
FIG. 11 illustrates write and read descriptor chains that may be used in the compression block of FIG. 10, in accordance with techniques described in this disclosure.

FIG. 11 illustrates write and read descriptor chains that may be used in the compression block of FIG. 10, in accordance with techniques described in this disclosure. Each descriptor in the descriptor chain includes information on the number of blocks used, the block size, a block output address, and a pointer to the next descriptor. Block size for reads is a running count of Size divided into 1024 chunks, with any leftover in the last descriptor.

Figure 12:
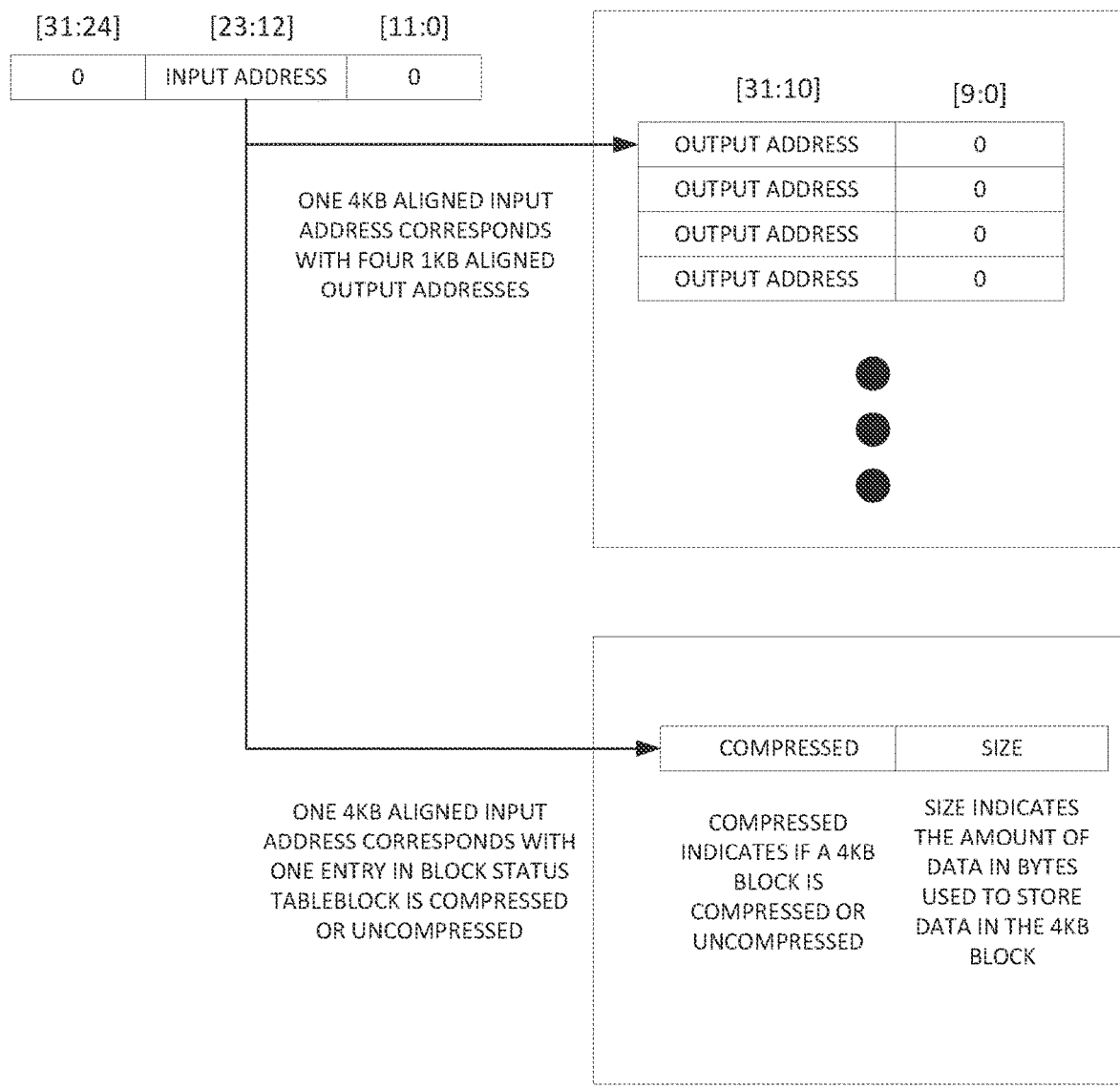
FIG. 12 illustrates an example Redirection Address Table and an example Block Status Table that may be used in the compression block of FIG. 10, in accordance with techniques described in this disclosure.

FIG. 12 illustrates an example Redirection Address Table and an example Block Status Table that may be used in the compression block of FIG. 10, in accordance with techniques described in this disclosure. In the example shown in FIG. 12, Redirection Address Table 808 receives a 4 KB aligned input address and determines the four 1 KB aligned Output addresses corresponding to the input address. At the same time, Block Status Table 810 receives the same 4 KB aligned input address and determines if the 4 KB block is compressed and its size.

Figure 13:
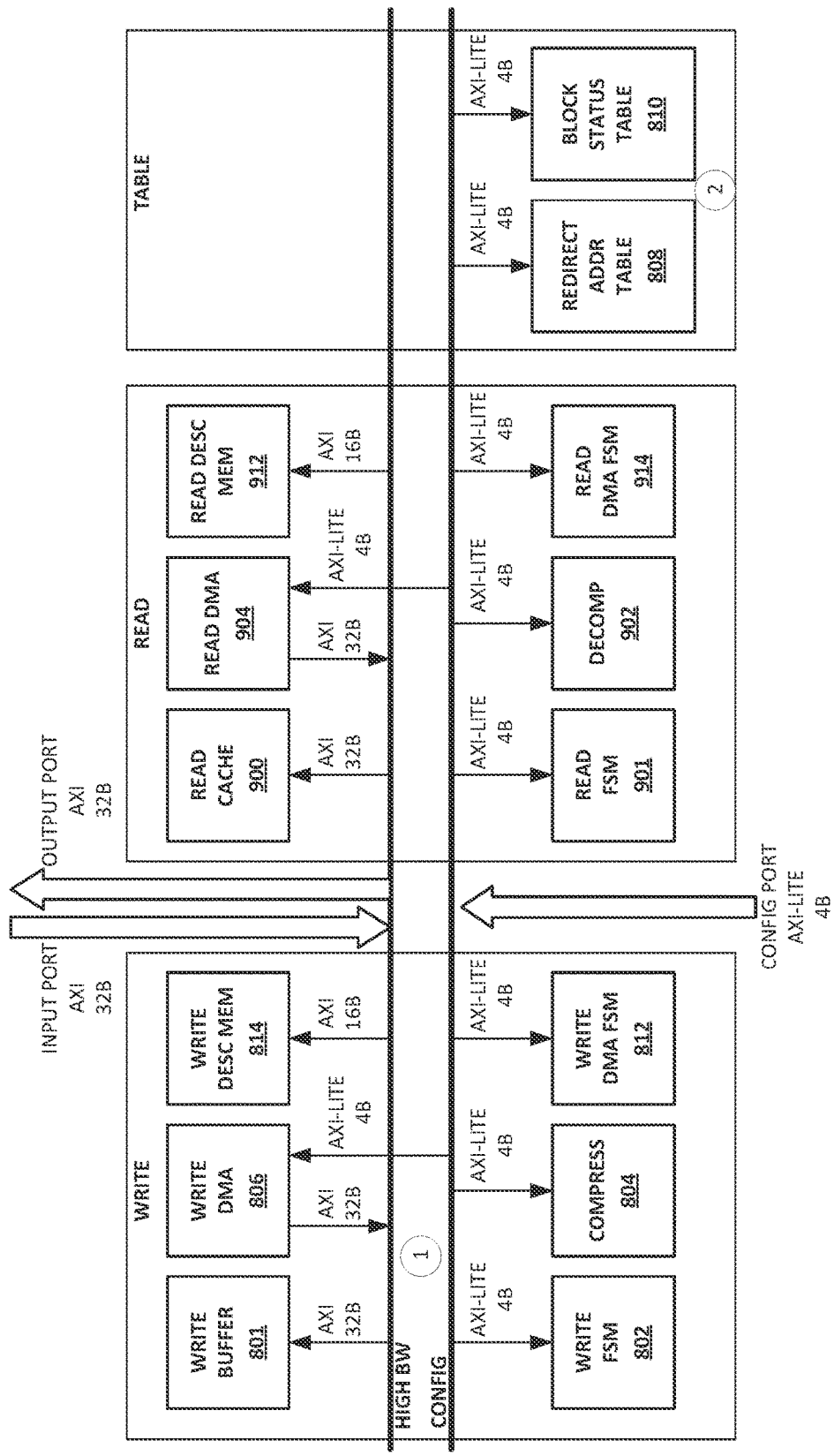
FIG. 13 illustrates example data and control interconnects that may be used with the compression block of FIG. 10, in accordance with techniques described in this disclosure.

FIG. 13 illustrates example data and control interconnects that may be used with the compression block of FIG. 10, in accordance with techniques described in this disclosure. In the example shown in FIG. 13, interconnect is split between high bandwidth and configuration interconnect. The configuration protocol doesn't have to be AXI-Lite, but the CAST units already support the AXI-Lite protocol. In the example shown in FIG. 13, high bandwidth interconnect is not provided to Redirection Address Table 808 or Block Status Table 810, since it is expected that software/firmware will be used to program Redirection Address Table 808. The Block Status Table includes an interconnect for use in debugging.

Figure 14:
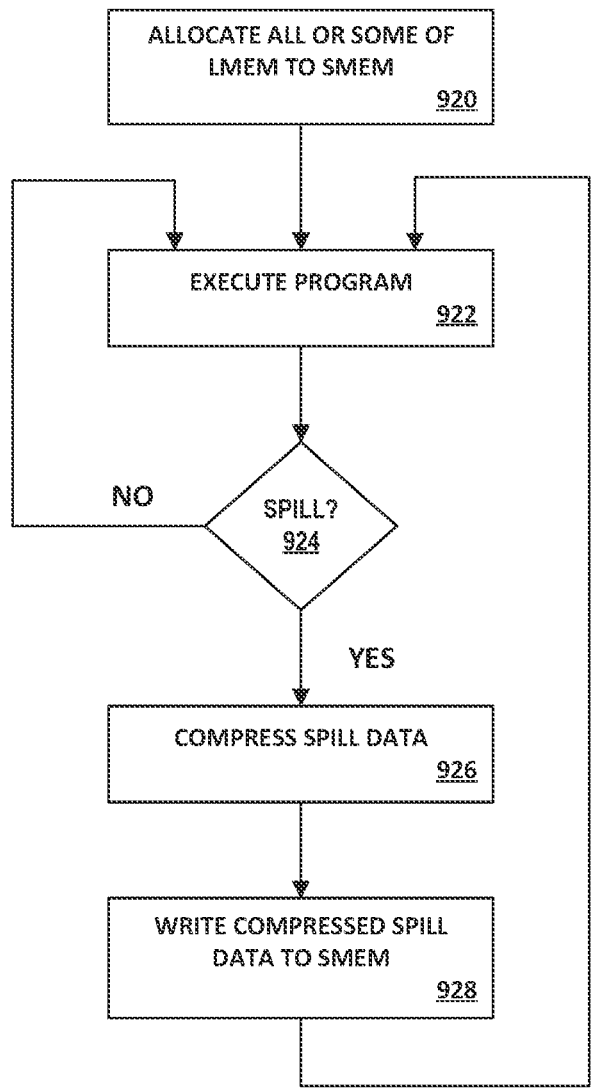
FIG. 14 is a flowchart depicting a write of compressed data to SMEM, in accordance with techniques described in this disclosure.

FIG. 14 is a flowchart depicting a write of compressed data to SMEM, in accordance with techniques described in this disclosure. In the example approach of FIG. 14, SRAM on the LMEM 564 associated with the compute element 620 running the machine learning program (that is, LMEM 564 B when the compute element running the program is compute element 620B) is allocated as activation data SMEM (920). The machine learning program executes on compute element 620 (922) and, if a spill is detected (924), data from the spill is compressed as blocks of compressed data (926) and written to VSMEM 155 (948). Otherwise, control returns to 922. In one example, compute element 620 signals whether compression block 704 should wait for additional data to fill a particular block or proceed to compress the data already received. In one such example, the memory allocated to activation data SMEM is allocated and deallocated as needed.

Figure 15:
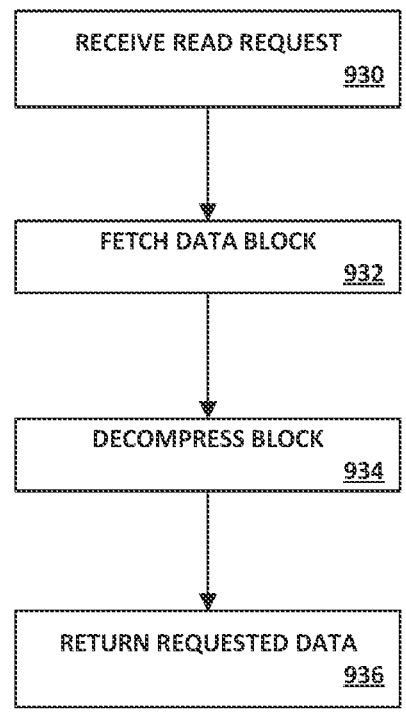
FIG. 15 is a flowchart depicting a read of compressed data from SMEM, in accordance with techniques described in this disclosure.

FIG. 15 is a flowchart depicting a read of compressed data from SMEM, in accordance with techniques described in this disclosure. In the example approach of FIG. 15, a read request is received for compressed spill data stored in activation data SMEM 565 (930). Compression block 704 fetches the requested data block (932) and decompresses the data block (934). Data read from the decompressed data block is then returned in response to the read request (936).

Figure 16:
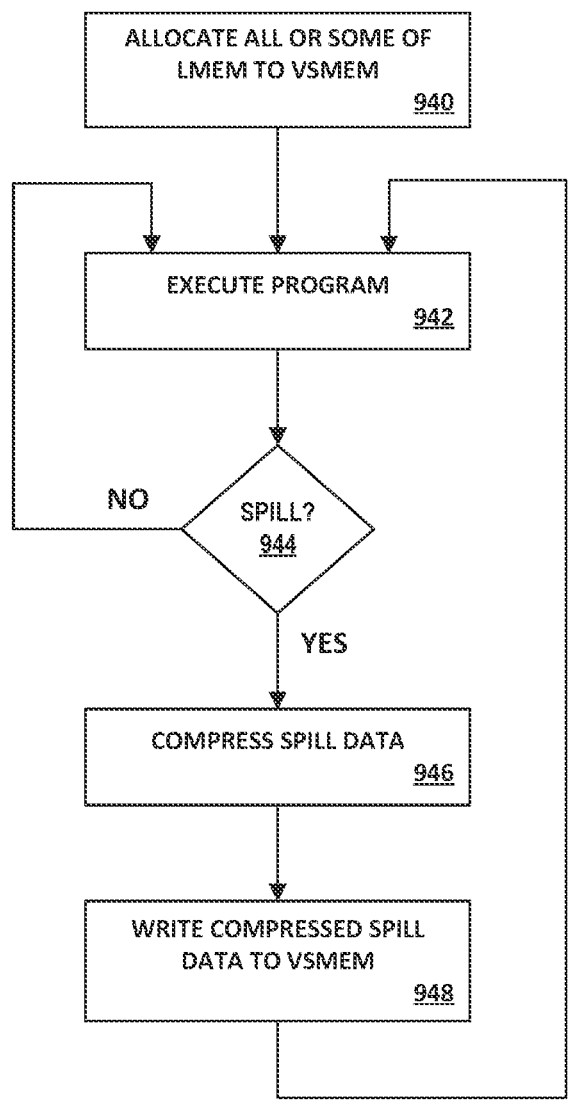
FIG. 16 is a flowchart depicting a write of compressed data to VSMEM, in accordance with techniques described in this disclosure.

FIG. 16 is a flowchart depicting a write of compressed data to VSMEM, in accordance with techniques described in this disclosure. In the example approach of FIG. 16, a portion of SRAM on the LMEM 564 associated with the compute element 620 running the machine learning program (that is, LMEM 564 B when the compute element running the program is compute element 620B) is allocated as VSMEM (940), with spill-over to DRAM 160. The machine learning program executes on compute element 620 (942) and, if a spill is detected (944), data from the spill is compressed as blocks of compressed data (946) and written to VSMEM 155 (948). Otherwise, control returns to 942. In one example, compute element 620 signals whether compression block 704 should wait for additional data to fill a particular block or proceed to compress the data already received. In one such example, the memory allocated to activation data SMEM is allocated and deallocated as needed.

In one example approach, a compiler represents spills as a graph and determines allocation of VSMEM 155 based on predicted needs. The compiler may automatically recognize skip connections and pass throughs and prefetch data from DRAM 160 based on such information.

Figure 17:
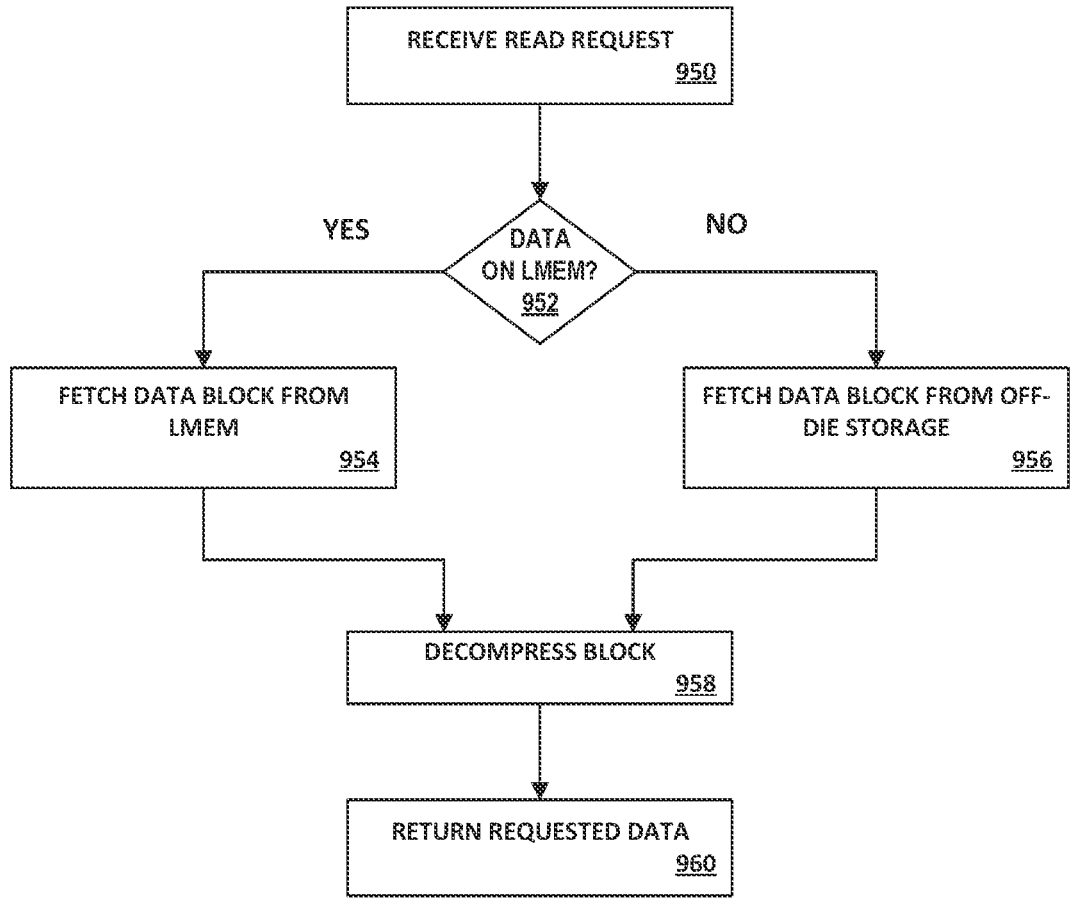
FIG. 17 is a flowchart depicting a read of compressed data from VSMEM, in accordance with techniques described in this disclosure.

FIG. 17 is a flowchart depicting a read of compressed data from VSMEM, in accordance with techniques described in this disclosure. In the example approach of FIG. 17, a read request is received for compressed spill data stored in activation data SMEM 565 (950). A check is made to determine if the data requested is in a compressed data block stored in LMEM 654 (952). If so, compression block 704 fetches the requested data block (954) and decompresses the data block (958). Data read from the decompressed data block is then returned in response to the read request (960).

If, however, the data requested is in not a compressed data block stored in LMEM 654 at (952), compression block 704 fetches the requested data block from off-die storage (e.g., DRAM 160) (958) and decompresses the data block (958). Data read from the decompressed data block is then returned in response to the read request (960). In some examples, the compressed data block fetched from DRAM 160 in response to the read request is also stored in LMEM 564, replacing the least recently used data block. In other examples, a pseudo LRU algorithm is used to determine the data block to be replaced.

The hardware, software, and firmware described above may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor or processing circuitry and/or logic circuitry, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

As described by way of various examples herein, the techniques of the disclosure may include or be implemented in conjunction with an artificial reality system. As described, artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured content (e.g., real-world photographs). The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may be associated with applications, products, accessories, services, or some combination thereof, that are, e.g., used to create content in an artificial reality and/or used in (e.g., perform activities in) an artificial reality. The artificial reality system that provides the artificial reality content may be implemented on various platforms, including a head-mounted device (HMD) connected to a host computer system, a standalone HMD, a mobile device or computing system, or any other hardware platform capable of providing artificial reality content to one or more viewers.

What is claimed is:

1. A system on a chip (SoC) comprising:
    a first subsystem, the first subsystem comprising a first compute element and a first local memory connected to the first compute element;
    a second subsystem, the second subsystem comprising a second compute element and a second local memory connected to the second compute element; and
    a compression block connected to the first and second subsystems, the compression block including a decoder and an encoder,
    wherein the compression block receives spill data generated by one of the first and second compute elements, compresses the spill data using the encoder and stores the compressed spill data in a data block in the local memory of one of the first and second compute elements,
    wherein the compression block receives read requests, from one of the first and second compute elements, for the compressed spill data stored in the local memory of one of the first and second compute elements, fetches the compressed spill data requested from local memory of one of the first and second compute elements, decompresses the compressed spill data requested using the decoder and returns the decompressed spill data to the compute element making the read request, and
    wherein the first local memory and the second local memory are each allocated as a virtualized static memory (VSMEM).

2. The SoC of claim 1, wherein the encoder applies a lossless compression algorithm to the spill data.

3. The SoC of claim 1, wherein the local memories are addressable as shared memory.

4. The SoC of claim 1, wherein the local memories are Static Random-Access Memory (SRAM).

5. The SoC of claim 4, wherein the local memories are allocated as a portion of a static memory (SMEM).

6. The SoC of claim 4, wherein a portion of the local memory serves as a physical address space for the VSMEM and a portion of off-die memory serves as storage for compressed data blocks that were replaced in the physical address space of VSMEM.

7. The SoC of claim 4, wherein a portion of the local memory serves as a physical address space for the VSMEM and a portion of off-die memory serves as storage for compressed data blocks that are aged out of the physical address space.

8. An artificial reality system comprising:
    a head mounted display (HMD) configured to output artificial reality content, the HMD including a display and at least one system on a chip (SoC), wherein the at least one SoC comprises:
    a first subsystem, the first subsystem comprising a first compute element and a first local memory connected to the first compute element;
    a second subsystem, the second subsystem comprising a second compute element and a second local memory connected to the second compute element; and a compression block connected to the first and second subsystems, the compression block including a decoder and an encoder, wherein the compression block receives spill data generated by one of the first and second compute elements, compresses the spill data using the encoder and stores the compressed spill data in a data block in the local memory of one of the first and second compute elements, wherein the compression block receives read requests, from one of the first and second compute elements, for the compressed spill data stored in the local memory of one of the first and second compute elements, fetches the compressed spill data requested from local memory of one of the first and second compute elements, decompresses the compressed spill data requested using the decoder and returns the decompressed spill data to the compute element making the read request, and wherein the first local memory and the second local memory are each allocated as a virtualized static memory (VSMEM).

9. The artificial reality system of claim 8, wherein the encoder applies a lossless compression algorithm to the spill data.

10. The artificial reality system of claim 8, wherein the local memories are addressable as shared memory.

11. The artificial reality system of claim 8, wherein the local memories are Static Random-Access Memory (SRAM).

12. The artificial reality system of claim 11, wherein the local memories are allocated as a portion of a static memory (SMEM).

13. The artificial reality system of claim 11, wherein a portion of the local memory serves as a physical address space for the VSMEM and a portion of off-die memory serves as storage for compressed data blocks that were replaced in the physical address space of VSMEM.

14. The artificial reality system of claim 8, wherein a portion of the local memory serves as a physical address space for the VSMEM and a portion of off-die memory serves as storage for compressed data blocks that are aged out of the physical address space.

15. In a system on a chip (SoC) having a first subsystem, a second subsystem and a compression block connected to the first and second subsystems, the compression block including a decoder and an encoder, wherein the first subsystem includes a first compute element connected to a first local memory and the second subsystem includes a second compute element connected to a second local memory, a method comprising:

receiving, at the compression block, spill data generated by one of the first and second compute elements;

compressing the spill data using the encoder; and storing the compressed spill data in a data block in the local memory of one of the first and second compute elements, wherein the first local memory and the second local memory are each allocated as a virtualized static memory (VSMEM).

16. The method of claim 15, wherein compressing includes applying a lossless compression algorithm to the spill data.

17. The method of claim 15, wherein the compression block receives read requests, from one of the first and second compute elements, for the compressed spill data stored in the local memory of one of the first and second compute elements, fetches the compressed spill data requested from the local memory of one of the first and second compute elements, decompresses the compressed spill data requested using the decoder and returns the decompressed spill data to the compute element making the read request.

18. The method of claim 15, wherein the local memories are Static Random-Access Memory (SRAM).

19. The method of claim 18, wherein a portion of the local memory serves as a physical address space for the VSMEM and a portion of off-die memory serves as storage for compressed data blocks that were replaced in the physical address space of VSMEM.

20. The method of claim 18, wherein a portion of the local memory serves as a physical address space for the VSMEM and a portion of off-die memory serves as storage for compressed data blocks that are aged out of the physical address space.

* * * * *